United States Patent
Lee et al.

(10) Patent No.: US 9,773,772 B2
(45) Date of Patent: Sep. 26, 2017

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Seungyoung Lee, Seoul (KR); Sanghoon Baek, Seoul (KR); Jung-Ho Do, Yongin-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 15/094,586

(22) Filed: Apr. 8, 2016

(65) Prior Publication Data

US 2016/0300826 A1    Oct. 13, 2016

(30) Foreign Application Priority Data

Apr. 9, 2015  (KR) .................. 10-2015-0050150
Oct. 5, 2015  (KR) .................. 10-2015-0139731

(51) Int. Cl.

| | | |
|---|---|---|
| *H01L 23/52* | (2006.01) | |
| *H01L 21/4763* | (2006.01) | |
| *H01L 27/02* | (2006.01) | |
| *H01L 23/522* | (2006.01) | |
| *H01L 23/528* | (2006.01) | |
| *H01L 29/78* | (2006.01) | |
| *H01L 29/66* | (2006.01) | |

(52) U.S. Cl.
CPC ........ *H01L 27/0207* (2013.01); *H01L 23/528* (2013.01); *H01L 23/5226* (2013.01); *H01L 29/66628* (2013.01); *H01L 29/7848* (2013.01)

(58) Field of Classification Search
CPC .......................... H01L 23/5226; H01L 23/528

USPC .................. 257/748, 758; 438/588, 622–631
See application file for complete search history.

(56) References Cited

U.S. PATENT DOCUMENTS

| | | |
|---|---|---|
| 6,054,872 A | 4/2000 | Fudanuki et al. |
| 6,536,028 B1 | 3/2003 | Katsioulas et al. |
| 7,039,881 B2 | 5/2006 | Regan |
| 7,299,440 B2 | 11/2007 | Yoshida et al. |
| 7,302,660 B2 | 11/2007 | Shimamura |

(Continued)

FOREIGN PATENT DOCUMENTS

| | | |
|---|---|---|
| JP | H08-213466 A | 8/1996 |
| JP | H09-185641 A | 7/1997 |

(Continued)

OTHER PUBLICATIONS

Synopsys, "Physical Library Analysis for Optimal 28-nm and 20-nm Routing (Version 3.0)", Router CAE, Synopsys 2012, Jul. 15, 2013, pp. 1-63.

*Primary Examiner* — Calvin Lee
(74) *Attorney, Agent, or Firm* — Sughrue Mion, PLLC

(57) ABSTRACT

A semiconductor device includes a substrate, a gate electrode on the substrate, an insulating layer on the gate electrode, first and second lower vias in the insulating layer, first and second lower metal lines provided on the insulating layer and respectively connected to the first and second lower vias, and first and second upper metal lines provided on and respectively connected to the first and second lower metal lines. When viewed in a plan view, the first lower via is overlapped with the second upper metal line, and the second lower via is overlapped with the first upper metal line.

13 Claims, 20 Drawing Sheets

(56) References Cited

U.S. PATENT DOCUMENTS

| | | |
|---|---|---|
| 7,321,139 B2 | 1/2008 | Chang et al. |
| 7,888,705 B2 | 2/2011 | Becker et al. |
| 7,919,792 B2 | 4/2011 | Law et al. |
| 7,989,849 B2 | 8/2011 | Sherlekar et al. |
| 8,063,414 B2 | 11/2011 | Uchida |
| 8,176,457 B2 | 5/2012 | Kato et al. |
| 8,220,696 B2 | 7/2012 | Kawada |
| 8,239,807 B2 | 8/2012 | Arora et al. |
| 8,255,837 B2 | 8/2012 | Lu et al. |
| 8,327,301 B2 | 12/2012 | Cheng et al. |
| 8,357,955 B2 | 1/2013 | Tanaka |
| 8,513,978 B2 | 8/2013 | Sherlekar |
| 8,584,052 B2 | 11/2013 | Chen et al. |
| 8,612,914 B2 | 12/2013 | Sherlekar et al. |
| 8,647,893 B1 | 2/2014 | Agarwal et al. |
| 8,661,392 B2 | 2/2014 | Quandt et al. |
| 8,729,606 B2 | 5/2014 | Becker et al. |
| 8,732,628 B1 | 5/2014 | Wu et al. |
| 8,739,095 B2 | 5/2014 | Cao et al. |
| 8,788,998 B2 | 7/2014 | Hatamian et al. |
| 8,863,063 B2 | 10/2014 | Becker et al. |
| 8,935,639 B1 | 1/2015 | Tzeng |
| 8,949,749 B2 | 2/2015 | Wang et al. |
| 8,959,472 B1 | 2/2015 | Frederick, Jr. et al. |
| 9,007,060 B2 | 4/2015 | Ausserlechner |
| 9,098,670 B2 | 8/2015 | Song et al. |
| 2003/0084418 A1 | 5/2003 | Regan |
| 2005/0198604 A1 | 9/2005 | Yoshida et al. |
| 2006/0138464 A1 | 6/2006 | Shimamura |
| 2007/0234243 A1* | 10/2007 | Kyoh .................. G06F 17/5077 716/52 |
| 2007/0284618 A1 | 12/2007 | Chang et al. |
| 2007/0300202 A1 | 12/2007 | Uchida |
| 2008/0111158 A1 | 5/2008 | Sherlekar et al. |
| 2008/0223502 A1 | 9/2008 | Kawada |
| 2008/0263500 A1 | 10/2008 | Kato et al. |
| 2009/0032898 A1 | 2/2009 | Becker et al. |
| 2010/0155783 A1 | 6/2010 | Law et al. |
| 2010/0187626 A1 | 7/2010 | Becker |
| 2010/0196803 A1 | 8/2010 | Lu et al. |
| 2010/0199253 A1 | 8/2010 | Cheng et al. |
| 2011/0049575 A1 | 3/2011 | Tanaka |
| 2011/0084312 A1 | 4/2011 | Quandt et al. |
| 2011/0145775 A1 | 6/2011 | Sano |
| 2011/0219341 A1 | 9/2011 | Cao et al. |
| 2011/0296366 A1 | 12/2011 | Arora et al. |
| 2012/0167021 A1 | 6/2012 | Chen et al. |
| 2012/0241986 A1 | 9/2012 | Sherlekar et al. |
| 2012/0249182 A1 | 10/2012 | Sherlekar |
| 2013/0021026 A1 | 1/2013 | Ausserlechner |
| 2013/0207199 A1 | 8/2013 | Becker et al. |
| 2014/0065728 A1 | 3/2014 | Agarwal et al. |
| 2014/0115546 A1 | 4/2014 | Wang et al. |
| 2014/0181774 A1 | 6/2014 | Hatamian et al. |
| 2014/0304671 A1 | 10/2014 | Lu et al. |
| 2014/0380256 A1 | 12/2014 | Song et al. |
| 2015/0095857 A1 | 4/2015 | Hsu et al. |
| 2016/0283634 A1* | 9/2016 | Kim .................. G06F 17/5072 27/2 |

FOREIGN PATENT DOCUMENTS

| | | |
|---|---|---|
| JP | H11-003943 A | 1/1999 |
| JP | 2003-529210 A | 9/2003 |
| JP | 4349790 A | 10/2009 |
| JP | 2011-124423 A | 6/2011 |
| JP | 2012-028479 A | 2/2012 |
| JP | 5151313 B2 | 2/2013 |
| JP | 2013-073139 A | 4/2013 |
| JP | 2014-236116 A | 12/2014 |
| JP | 5758815 B2 | 8/2015 |
| KR | 10-0846089 B1 | 7/2008 |
| KR | 10-0935125 B1 | 1/2010 |
| KR | 10-2015-0035405 A | 4/2015 |
| KR | 10-1532858 B1 | 6/2015 |

* cited by examiner

SEMICONDUCTOR DEVICE AND METHOD OF FABRICATING THE SAME

CROSS-REFERENCE TO RELATED APPLICATIONS

This application claims priority from Korean Patent Applications Nos. 10-2015-0050150 and 10-2015-0139731, filed on Apr. 9, 2015 and Oct. 5, 2015, respectively, in the Korean Intellectual Property Office, the entire contents of which are hereby incorporated by reference.

BACKGROUND

Apparatuses and methods consistent with the present disclosure relate to a semiconductor device and a method of fabricating the same, and in particular, to a semiconductor device including a field effect transistor and a method of designing a layout thereof, and a method of fabricating the semiconductor device.

Due to their small-sized, multifunctional, and/or low-cost characteristics, semiconductor devices are being esteemed as important elements in the electronic industry. The semiconductor devices may be classified into a memory device for storing data, a logic device for processing data, and a hybrid device including both of memory and logic elements. To meet the increased demand for electronic devices with fast speed and/or low power consumption, it is advantageous to realize semiconductor devices with high reliability, high performance, and/or multiple functions. Accordingly, complexity and/or integration density of semiconductor devices are being increased.

SUMMARY

One or more exemplary embodiments provide a semiconductor device, in which an interconnection structure of connecting lower metal lines to upper metal lines is provided.

One or more exemplary embodiments also provide a layout design method including an operation of swapping adjacent ones of upper metal patterns with each other and a method of fabricating a semiconductor device using a layout prepared through the layout design method.

According to an aspect of an exemplary embodiment, there is provided a semiconductor device including a substrate, a gate electrode crossing an active pattern of the substrate; an interlayer insulating layer covering the active pattern and the gate electrode; a first lower via provided in the interlayer insulating layer and electrically connected to the active pattern; a second lower via provided in the interlayer insulating layer and electrically connected to the gate electrode; a first lower metal line provided on the interlayer insulating layer, the first lower metal line extending in a first direction and directly contacting the first lower via; a second lower metal line provided on the interlayer insulating layer, the second lower metal line extending in the first direction and directly contacting the second lower via; a first upper metal line provided on the first and second lower metal lines, the first upper metal line extending in a second direction crossing the first direction and being electrically connected to the first lower metal line; and a second upper metal line provided on the first and second lower metal lines, the second upper metal line extending in the second direction and being electrically connected to the second lower metal line, wherein, when viewed in a plan view, the first lower via is overlapped with the second upper metal line and the second lower via is overlapped with the first upper metal line.

A width of the second lower metal line may be greater than a width of the first lower metal line.

The device may further comprise a first upper via provided between the first lower metal line and the first upper metal line, the first upper via electrically connecting the first lower metal line and the first upper metal line; and a second upper via provided between the second lower metal line and the second upper metal line, the second upper via electrically connecting the second lower metal line and the second upper metal line, wherein, when viewed in a plan view, the first upper via is spaced apart from the first lower via in the first direction, and the second upper via is spaced apart from the second lower via in a direction opposite to the first direction.

The device may further comprise a third lower via provided in the interlayer insulating layer, the third lower via electrically connecting to another active pattern of the substrate; and a third lower metal line provided on the interlayer insulating layer, the third lower metal line extending in the first direction and directly contacting the third lower via, wherein the third lower metal line is electrically connected to the first upper metal line, and the third lower via is overlapped with the second upper metal line, when viewed in a plan view.

The first and second lower metal lines may be positioned at substantially the same level, when viewed in the plan view, the first and second upper metal lines may be positioned at substantially the same level, when viewed in the plan view, the first and second lower metal lines may be spaced apart from each other in the second direction, and the first and second upper metal lines may be spaced apart from each other in the first direction.

The active pattern may source and drain regions provided at both sides of the gate electrode, and the first lower via may be electrically connected to at least one of the source/drain regions.

The device may further include a device isolation layer provided in the substrate to define the active pattern, wherein the active pattern comprises an upper portion protruding upward from the device isolation layer.

According to an aspect of another exemplary embodiment, there is provided a semiconductor device including a substrate, a plurality of transistors disposed on the substrate; a first interlayer insulating layer covering the transistors; a first lower via and a second lower via provided in the first interlayer insulating layer, each of the first and second lower vias being electrically connected to at least one of the transistors; a first lower metal line provided on the first interlayer insulating layer, the first lower metal line extending in a first direction and directly contacting the first lower via; a second lower metal line provided on the first interlayer insulating layer, the second lower metal line extending in the first direction and directly contacting the second lower via; a second interlayer insulating layer covering the first and second lower metal lines; a first upper via provided in the second interlayer insulating layer, the first upper via directly contacting the first lower metal line; a second upper via provided in the second interlayer insulating layer, the second upper via directly contacting the second lower metal line; a first upper metal line provided on the second interlayer insulating layer, the first upper metal line extending in a second direction crossing the first direction and directly contacting the first upper via; and a second upper metal line provided on the second interlayer insulating layer, the second upper metal line extending in the second direction and directly contacting the second upper via, wherein, when viewed in a plan view, the first upper via is spaced apart from the first lower via in the first direction and the second upper via is spaced apart from the second lower via in a direction opposite to the first direction.

A width of the second lower metal line may be greater than a width of the first lower metal line.

When viewed in a plan view, the first lower via may be overlapped with the second upper metal line and the second lower via may be overlapped with the first upper metal line.

When viewed in a plan view, an end portion of the first lower metal line and an end portion of the second lower metal line may be disposed to be parallel to the second upper metal line.

The first lower via, the first lower metal line, and the first upper via may be disposed to allow signals output from the transistor that is connected to the first lower via to be transmitted to the first upper metal line through the first lower via, the first lower metal line and the first upper via.

The second upper metal line, the second upper via, the second lower metal line, and the second lower via may be disposed to allow signals to be applied from the second upper metal line to a gate of the transistor that is connected to the second lower via.

According to an aspect of another exemplary embodiment, there is provided a method of fabricating a semiconductor device, the method including preparing a layout pattern; manufacturing a photomask using the layout pattern; and forming a plurality of metal lines and a plurality of vias on a substrate, using the photomask, the vias electrically connecting the metal lines, wherein the preparing of the layout pattern comprises laying out a first via pattern, a first lower metal pattern, and a first upper metal pattern, the first via pattern being at an intersect area between the first lower metal pattern and the first upper metal pattern; laying out a second via pattern, a second lower metal pattern, and a second upper metal pattern, the second via pattern being at an intersect area between the second lower metal pattern and the second upper metal pattern; categorizing the first via pattern into a risk via; and swapping a group of the first via pattern and the first upper metal pattern with another group of the second via pattern and the second upper metal pattern.

The first and second lower metal patterns may extend parallel to each other in a first direction, and the first and second upper metal patterns may extend parallel to each other in a second direction crossing the first direction.

An end portion of the first lower metal pattern and an end portion of the second lower metal pattern may be adjacent to a boundary of a layout cell, and the categorizing of the first via pattern into the risk via may comprise defining the first via pattern as the risk via, when the first via pattern is adjacent to the end portion of the first lower metal pattern.

A width of the second lower metal pattern may be greater than a width of the first lower metal pattern.

The categorizing of the first via pattern into the risk via may include defining the first via pattern as the risk via, when a distance between a first side of the first via pattern and a second side of the first lower metal pattern is smaller than a threshold distance, and the first and second sides are positioned adjacent to and facing each other.

The preparing of the layout pattern may further include laying out a third lower metal pattern and a third via pattern, the third via pattern being at an intersect area between the first upper metal pattern and the third lower metal pattern; and categorizing the third via pattern into the risk via, wherein a group of the first and third via patterns and the first upper metal pattern is swapped with the another group of the second via pattern and the second upper metal pattern.

When viewed in a plan view, an end portion of the first lower metal pattern and an end portion of the second lower metal pattern may be disposed to be adjacent to and parallel to a boundary of a layout cell.

The laying out of the first and second lower metal patterns may include laying out lower metal lines to cross a layout cell; and laying out cutting patterns on the lower metal lines, wherein the cutting patterns are used to divide at least one of the lower metal lines into a plurality of the lower metal patterns.

According to an aspect of another exemplary embodiment, there is provided a method of fabricating a semiconductor device, the method including laying out a plurality of lower metal lines that extend in a first direction, and a plurality of lower vias electrically connected to a lower surface of the lower metal lines; laying out a plurality of upper metal lines that extend in a second direction crossing the first direction, and a plurality of upper vias electrically connecting the upper metal lines to the lower metal lines; identifying a risk via from among the upper vias; and swapping a group of a first upper metal line connected to the identified risk via and the upper vias connected to the first upper metal line, with a group of a second upper metal line that is not connected to the identified risk via and the upper vias connected to the second upper metal line.

An upper via that is disposed adjacent to an end portion of a lower metal line may be identified as the risk via.

An upper via that is disposed adjacent to a cell boundary may be identified as a risk via.

An upper via disposed within a threshold distance from an end portion of a lower metal line may be identified as the risk via.

A layout of the lower metal lines and the lower vias may be maintained when the groups are swapped.

BRIEF DESCRIPTION OF THE DRAWINGS

The above and/or other exemplary aspects will become apparent and more readily appreciated from the following description of exemplary embodiments, taken in conjunction with the accompanying drawings in which.

DETAILED DESCRIPTION

Figure 1:
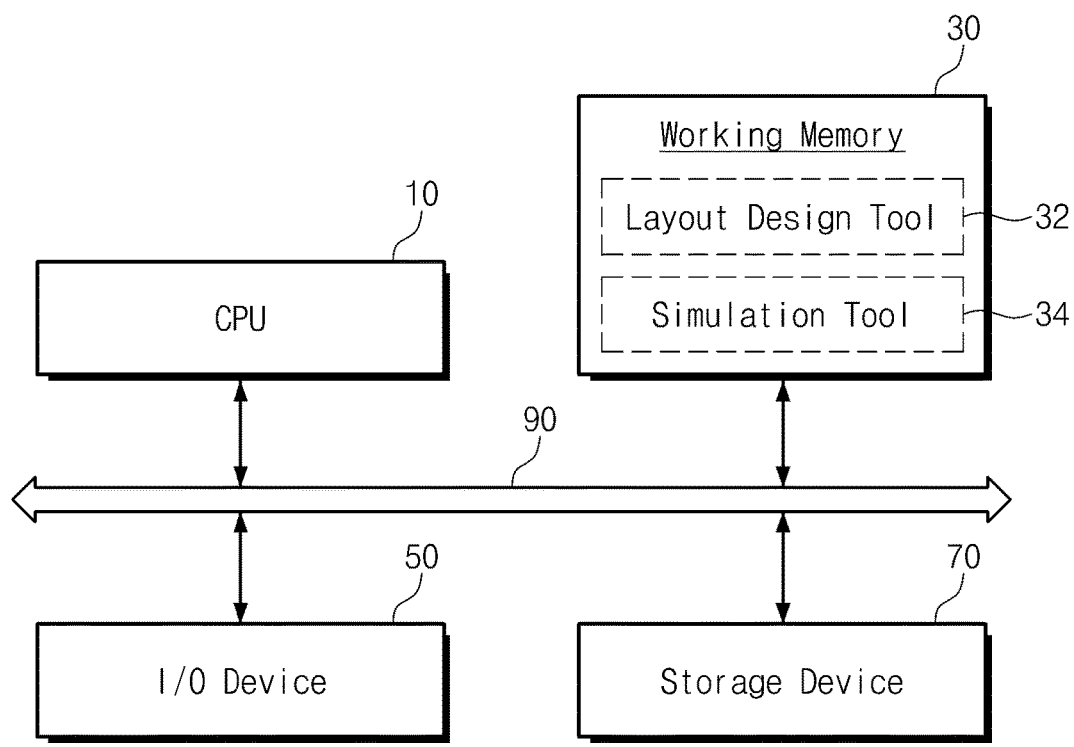
FIG. 1 is a block diagram illustrating a computer system for performing a semiconductor design process, according to an exemplary embodiment.

Exemplary embodiments will now be described more fully with reference to the accompanying drawings, in which certain exemplary embodiments are shown. Exemplary embodiment may, however, be embodied in many different forms and should not be construed as being limited to the exemplary embodiments set forth herein; rather, these exemplary embodiments are provided so that this disclosure will be thorough and complete, and will fully convey the concept of exemplary embodiments to those of ordinary skill in the art.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given exemplary embodiment, and should not be interpreted as defining or limiting the range of values or properties encompassed by exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a "first" element, component, region, layer or section discussed below could be termed a "second" element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a computer system for performing a semiconductor design process, according to an exemplary embodiment. Referring to FIG. 1, a computer system may include a central processing unit (CPU) 10, a working memory 30, an input-output (I/O) device 50, and a storage device 70. In some exemplary embodiments, the computer system may be provided in the form of a customized system for performing a layout design process according to some exemplary embodiments. Furthermore, the computer system may include a computing system configured to carry out various design and check simulation programs.

The CPU 10 may be configured to run a variety of software, such as application programs, operating systems, and device drivers. For example, the CPU 10 may be configured to run an operating system loaded on the working memory 30. Further, the CPU 10 may be configured to run various application programs on the operating system. For example, the CPU 10 may be configured to run a layout design tool 32 loaded on the working memory 30.

The operating system or application programs may be loaded on the working memory 30. For example, when the computer system starts a booting operation, an operating system (OS) image stored in the storage device 70 may be loaded on the working memory 30 according to a booting sequence. In the computer system, overall input/output operations may be managed by the operating system. Similarly, some application programs, which may be selected by a user or be provided for basic services, may be loaded on the working memory 30. For example according to some exemplary embodiments, the layout design tool 32 prepared for a layout design process may be loaded on the working memory 30, from the storage device 70.

The layout design tool 32 may provide a function for changing biasing data for specific layout patterns; for example, the layout design tool 32 may be configured to allow the specific layout patterns to have shapes and positions different from those defined by a design rule. The layout design tool 32 may be configured to perform a design rule check (DRC) under the changed condition of the biasing data. The working memory 30 may be one of volatile memory devices (e.g., static random access memory (SRAM) or dynamic random access memory (DRAM) devices) or nonvolatile memory devices (e.g., PRAM, MRAM, ReRAM, FRAM, NOR FLASH memory devices), or a mix thereof.

In addition, a simulation tool 34 may be loaded in the working memory 30 to perform an optical proximity correction (OPC) operation on the designed layout data.

The input-output (I/O) device 50 may be configured to control user input and output operations of user interface devices. For example, the input-output (I/O) device 50 may include a keyboard or a monitor, allowing a designer to input relevant information. By using the input-output (I/O) device 50, the designer may receive information on a semiconductor region or data paths, to which adjusted operating characteristics will be applied. The input-output (I/O) device 50 may be configured to display a progress status or a process result of the simulation tool 34.

The storage device 70 may serve as a storage medium for the computer system. The storage device 70 may be configured to store application programs, an OS image, and various data. The storage device 70 may be provided in the form of one of memory cards (e.g., MMC, eMMC, SD, MicroSD, and so forth) or a hard disk drive (HDD). The storage device 70 may include a NAND FLASH memory device with a large memory capacity. Alternatively, the storage device 70 may include at least one of next-generation nonvolatile memory devices (e.g., PRAM, MRAM, ReRAM, or FRAM) or NOR FLASH memory devices. In some exemplary embodiments, the storage device 70 may include a plurality of the forms of memory. For example, the storage device 70 may include a memory card and a hard disk drive, etc.

A system interconnector 90 may be provided to serve as a system bus for realizing a network in the computer system. The CPU 10, the working memory 30, the input-output device 50, and the storage device 70 may be electrically connected to each other through the system interconnector 90, and thus, data may be exchanged therebetween. However, the system interconnector 90 is not limited to the afore-described configuration; for example, the system interconnector 90 may further include an additional element for increasing efficiency in data communication.

Figure 2:
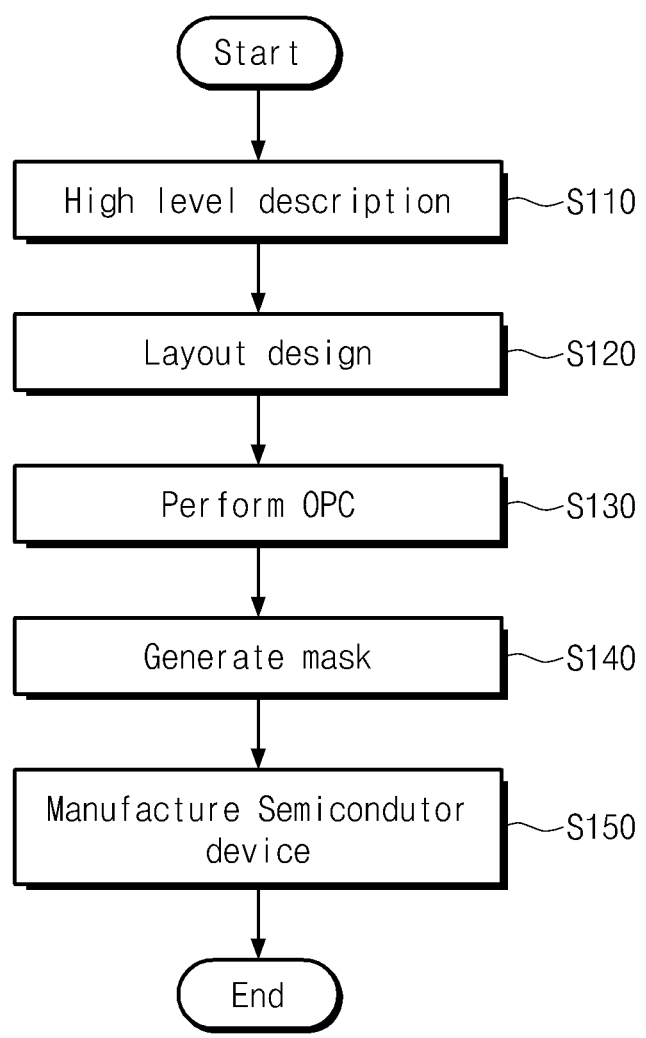
FIG. 2 is a flow chart illustrating a method of designing a layout of and manufacturing a semiconductor device, according to an exemplary embodiment.

FIG. 2 is a flow chart illustrating a method of designing and manufacturing a semiconductor device, according to an exemplary embodiment.

Referring to FIG. 2, a high-level design process for a semiconductor integrated circuit may be performed to produce a high level description using the computer system described with reference to FIG. 1 (in S110). For example, in the high-level design process, an integrated circuit to be designed may be described in terms of high-level computer language (e.g., C language). Circuits designed by the high-level design process may be more concretely described by a register transfer level (RTL) coding or a simulation. Further, codes generated by the RTL coding may be converted into a netlist, and the results may be combined with each other to wholly describe a semiconductor device. The combined schematic circuit may be verified by a simulation tool. In certain exemplary embodiments, an adjusting operation may be further performed, in consideration of a result of the verification operation.

A layout design process may be performed to realize a logically-complete form of the semiconductor integrated circuit on a silicon wafer (in S120). For example, the layout design process may be performed in consideration of the schematic circuit prepared in the high-level design process or the corresponding netlist. The layout design process may include a routing operation of placing and connecting cells provided from a cell library, based on a predetermined design rule. According to some exemplary embodiments, the layout design process may include an operation of extracting information on at least one via pattern (e.g., risk vias), which are likely to have a process risk. The layout design process may further include an operation of exchanging the risk via and an upper metal pattern connected thereto with a neighboring via pattern and another upper metal pattern connected thereto.

The cell library may contain information on operation, speed, and power consumption of cells. The cell library for representing a layout of a circuit in a gate level may be defined in the layout design tool. Here, the layout may be prepared to define or describe shapes, positions, or dimensions of patterns constituting transistors and metal lines, which will be actually formed on a silicon wafer. For example, in order to actually form an inverter circuit on a silicon wafer, a layout for patterns (e.g., PMOS, NMOS, N-WELL, gate electrodes, and metal lines thereon) may be prepared or drawn. For this layout for patterns, suitable one(s) of inverters in the cell library may be selected. Thereafter, a routing operation of connecting the selected cells to each other may be performed. These operations may be automatically or manually performed in the layout design tool.

After the routing operation, a verification operation may be performed on the layout to check whether there is a portion violating the given design rule. In some exemplary embodiments, the verification operation may include evaluating verification items, such as a design rule check (DRC), an electrical rule check (ERC), and a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

An optical proximity correction (OPC) operation may be performed (in S130). The OPC operation may be performed to correct optical proximity effects, which may occur when a photolithography process is performed on a silicon wafer using a photomask manufactured based on the layout. The optical proximity effect may be an unintended optical effect (such as refraction or diffraction) which may occur in the exposing process using the photomask manufactured based on the layout. In the OPC operation, the layout may be modified to have a reduced difference in shape between designed patterns and actually-formed patterns, which may be caused by the optical proximity effects. As a result of the optical proximity correction operation, the designed shapes and positions of the layout patterns may be slightly changed.

A photomask may be generated, based on the layout modified by the OPC operation (in S140). In general, the photomask may be generated by patterning a chromium layer provided on a glass substrate, using the layout pattern data.

The photomask may be used to manufacture a semiconductor device (in S150). In the actual manufacturing process, the exposing and etching operations may be repeatedly performed, and thus, patterns defined in the layout design process may be sequentially formed on a semiconductor substrate.

Figure 3:
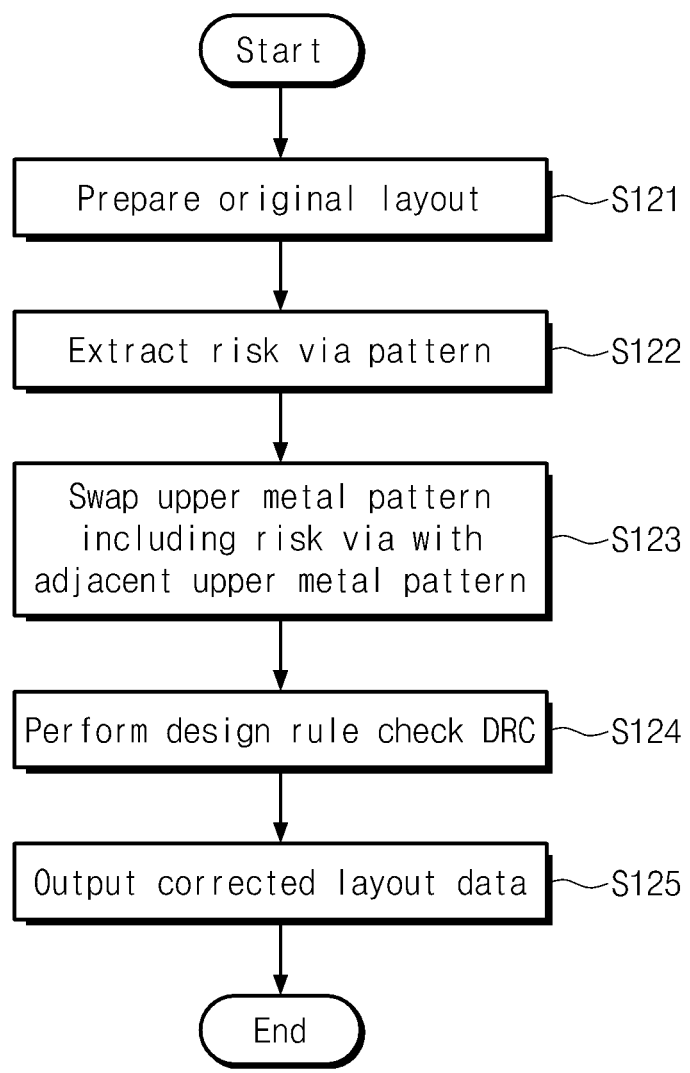
FIG. 3 is a flow chart illustrating the layout design method of FIG. 2, according to an exemplary embodiment.
Figure 4:
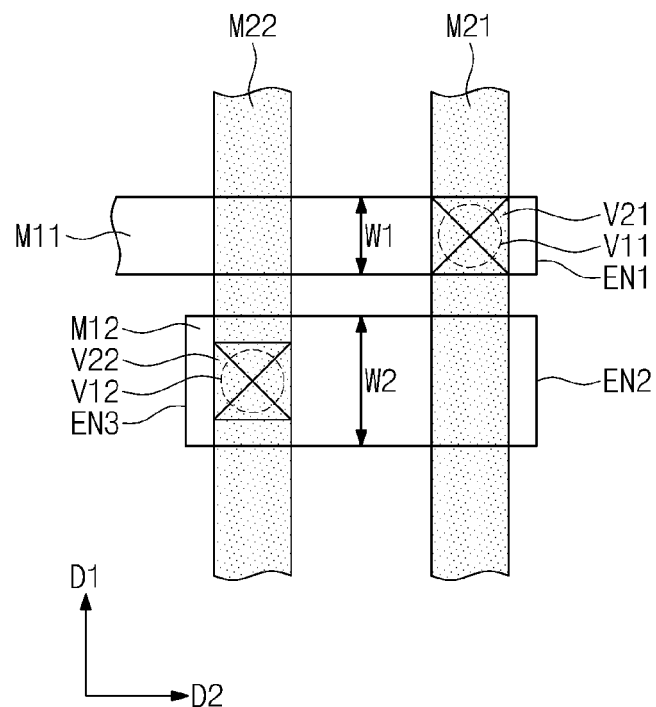
FIGS. 4 through 6 are plan views of layout patterns, which are presented to describe a method of designing a metal layout, according to some exemplary embodiments.
Figure 5:
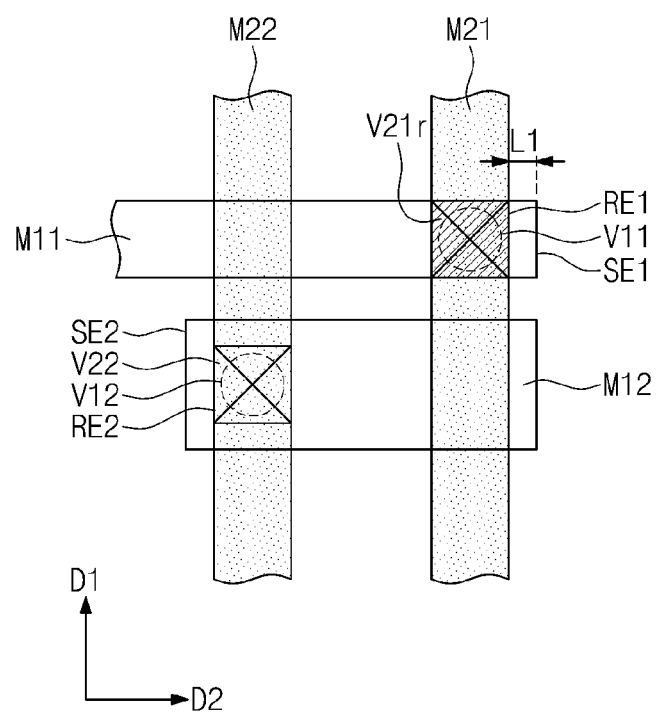
Figure 6:
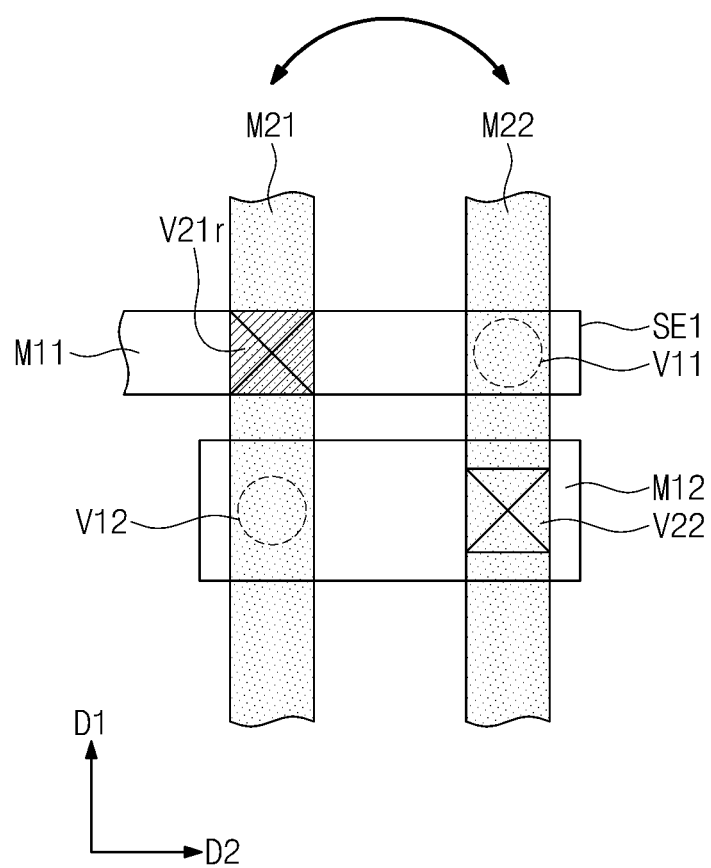

FIG. 3 is a flow chart illustrating an example of the layout design method of FIG. 2, according to an exemplary embodiment. FIGS. 4 through 6 are plan views of layout patterns, which are illustrated to describe a method of designing a metal layout and, in particular, a method of exchanging positions of upper metal patterns, according to some exemplary embodiments. For example, FIGS. 4 through 6 may illustrate layouts for lower vias, a first metal layer, upper vias, and a second metal layer, which will be sequentially formed on a semiconductor substrate.

Referring to FIGS. 3 and 4, an original layout may be prepared using a layout design tool (in S121). The preparation of the original layout may include providing lower via patterns, lower metal patterns, upper via patterns, and upper metal patterns. As described above, this process may include placing cells provided from the cell library. FIG. 4 may illustrate an example of the lower via patterns, the lower metal patterns, the upper via patterns, and the upper metal patterns that are provided in one of the cells.

The lower metal patterns may include a first lower metal pattern M11 and a second lower metal pattern M12, the upper metal patterns may include a first upper metal pattern M21 and a second upper metal pattern M22, the lower via patterns may include a first lower via pattern V11 and a second lower via pattern V12, and the upper via patterns may include a first upper via pattern V21 and a second upper via pattern V22.

Each of the first and second upper metal patterns M21 and M22 may be defined to be a line-shape structure extending in a first direction D1. The first and second lower metal patterns M11 and M12 may be defined to be a line-shaped structure extending in a second direction D2 crossing the first direction D1. As an example, the second lower metal pattern M12 may be defined to extend from the second upper metal pattern M22 to the first upper metal pattern M21. The first and second lower metal patterns M11 and M12 may be defined to have end portions EN1 and EN2, respectively, which are disposed adjacent to the first upper metal pattern M21 and are parallel to each other. In other words, the end portions EN1 and EN2 of the first and second lower metal patterns M11 and M12, respectively, may extend beyond the upper metal pattern M21 in the direction D2 as shown in the example of FIG. 4. The second lower metal pattern M12 may be defined to have an end portion EN3 that is opposite to the end portion EN2 and is positioned adjacent to the second upper metal pattern M22. In other words, the end portion EN3 may extend beyond the upper metal pattern M22 in a direction opposite to the direction D2, as shown in the example of FIG. 4.

The first lower metal pattern M11 may have a first width W1 in the first direction D1, and the second lower metal pattern M12 may have a second width W2 in the first direction D1. The second width W2 may be greater than the first width W1.

The first lower via pattern V11 may be disposed below the first lower metal pattern M11. As an example, when viewed in a plan view, the first lower via pattern V11 may be overlapped with the first upper metal pattern M21. The second lower via pattern V12 may be disposed below the second lower metal pattern M12. As an example, when viewed in a plan view, the second lower via pattern V12 may be overlapped with the second upper metal pattern M22.

The first upper via pattern V21 may be interposed between the first lower metal pattern M11 and the first upper metal pattern M21, when viewed in a vertical section, and may be overlapped with the first lower metal pattern M11 and the first upper metal pattern M21, when viewed in a plan view. In other words, the first upper via pattern V21 may be at an intersect area between the first lower metal pattern M11 and the first upper metal pattern M21, when viewed in a plan view. The second upper via pattern V22 may be interposed between the second lower metal pattern M12 and the second upper metal pattern M22, when viewed in a vertical section, and may be overlapped with the second lower metal pattern M12 and the second upper metal pattern M22, when viewed in a plan view. In other words, the second upper via pattern V22 may be at an intersect area between the second lower metal pattern M12 and the second upper metal pattern M22, when viewed in a plan view.

Referring to FIGS. 3 and 5, at least one risk via V21r may be extracted from the upper via patterns V21 and V22 (in S122). For example, each of the upper via patterns V21 and V22 may be examined to determine whether the upper via patterns V21 and V22 have a process risk in terms of their dispositions relative to the lower metal patterns M11 and M12, and if there is a process risk, such an upper via pattern may be defined as a risk via. In some exemplary embodiments, the first upper via pattern V21 may be extracted as the risk via V21r.

As an example of the process risk on the upper via patterns V21 and V22, a short risk may occur between upper vias and lower metal lines thereunder. The short risk may result from misalignment between the upper vias and the lower metal lines, which may occur when the upper vias are formed. The process risk may be more easily produced, when a layout is designed to allow the upper via pattern to be spaced apart from an end portion of the lower metal pattern by a distance smaller than a threshold distance. The threshold distance may be predetermined.

For example, the end portion EN1 of the first lower metal pattern M11 may have a first side SE1 (see FIG. 5). The first upper via pattern V21 may have a second side RE1 facing the first side SE1. Here, the first side SE1 and the second side RE1 may be spaced apart from each other by a first distance L1. The first distance L1 may be chosen to be smaller than a threshold distance, at which the process risk is assumed to occur. In this case, the first upper via pattern V21 may have the process risk in terms of its disposition relative to the first lower metal pattern M11, and thus, the first upper via pattern V21 may be categorized as the risk via V21r. If the first distance L1 is larger than the threshold distance, the first upper via pattern V21 may not be categorized into the risk via.

By contrast, the second lower metal pattern M12 may be provided to have a relatively large width. Accordingly, even when a third side SE2 of the end portion EN3 of the second lower metal pattern M12 is spaced apart from the fourth side RE2 of the second upper via pattern V22 by a relatively small distance, it is possible to prevent or suppress the second upper via pattern V22 from suffering from the process risk.

Referring to FIGS. 3 and 6, the first upper metal pattern M21 and the second upper metal pattern M22 may be swapped with each other (in S123). The first upper via pattern V21 (e.g., the risk via V21r) along with the first upper metal pattern M21 may constitute a single group to be moved to a position of the second upper metal pattern M22. Similarly, the second upper via pattern V22 along with the second upper metal pattern M22 may constitute a single group to be moved to a position of the first upper metal pattern M21. That is, it is possible to swap the first upper metal pattern M21 and the first upper via pattern V21 with the second upper metal pattern M22 and the second upper via pattern V22, while fixing the lower via patterns V11 and V12 and the lower metal patterns M11 and M12.

In the case where the afore-described two groups are swapped with each other, the risk via V21r may not have the process risk any more. This is because a distance between the risk via V21r and the first side SE1 of the first lower metal pattern M11 is increased to a value larger than the threshold distance. The second upper via pattern V22 may still be positioned on the second lower metal pattern M12 having a relatively large width and thus, it may not have the process risk.

According to the afore-described exemplary embodiments, the layout design method may include performing a swapping operation on the upper via patterns and the upper metal connected thereto, and this may make it possible to efficiently reduce a possibility of the process risk, while preserving an original layout for lower patterns to be provided below the upper via patterns. In addition, in order to reduce the possibility of the process risk, there is no need to increase dimensions of the lower metal patterns and a size of a cell, and thus, it is possible to realize a highly-integrated semiconductor device.

Next, a design rule check (DRC) may be performed on the changed layout (in S124). The DRC may be performed to examine whether there is an additional process risk in the risk vias, on which the position correction process has been performed. If there is no process risk, the layout data changed from the original layout may be output (in S125).
****

Figure 7:
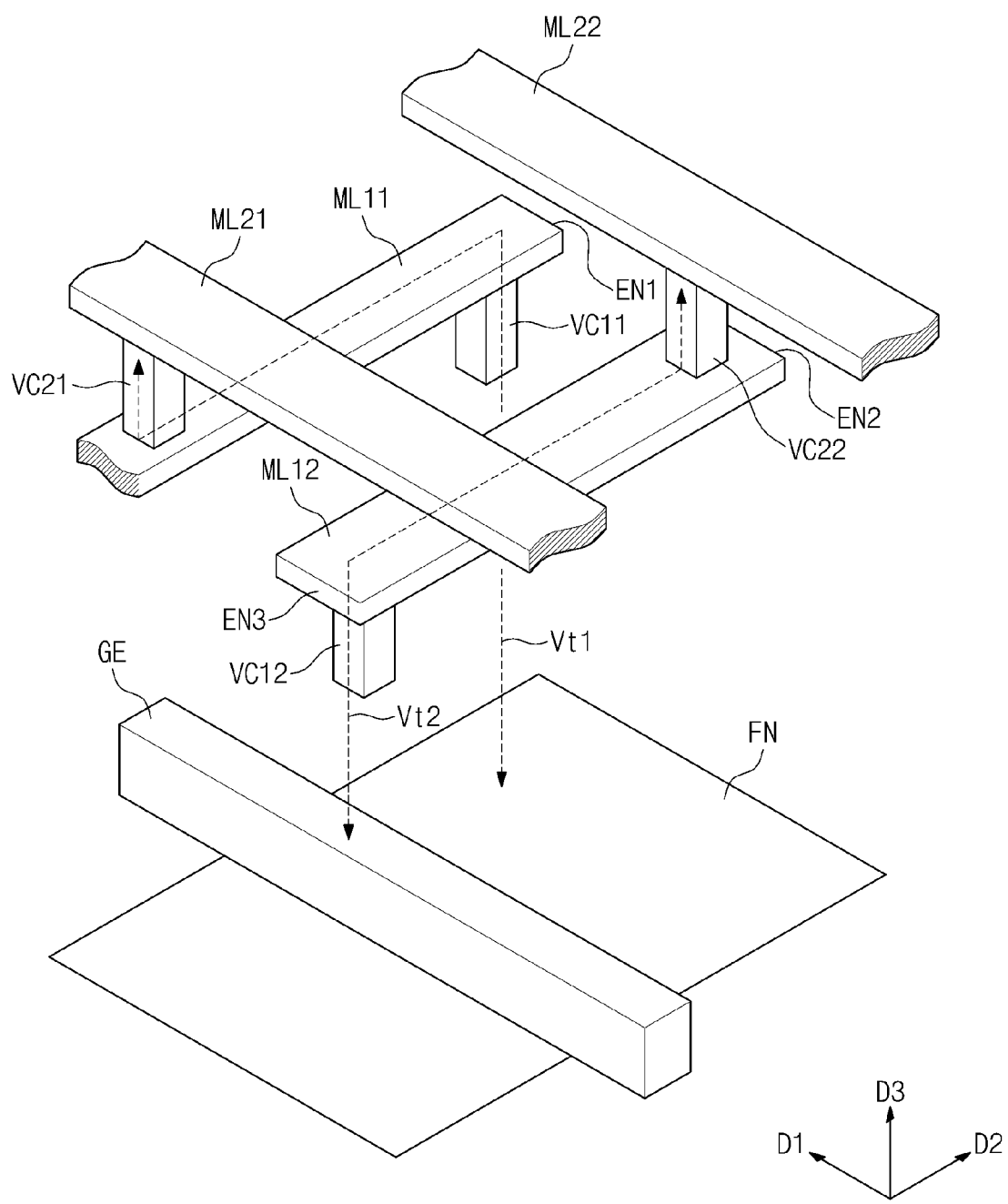
FIG. 7 is a perspective view illustrating a semiconductor device according to an exemplary embodiment.

FIG. 7 is a perspective view illustrating a semiconductor device according to an exemplary embodiment. For example, FIG. 7 may be a perspective view illustrating lower vias, a first metal layer, upper vias, and a second metal layer, which are formed based on the layout of FIG. 6.

Referring to FIG. 7, a first lower metal line ML11 and a second lower metal line ML12 may be provided to extend in the second direction D2. The first and second lower metal lines ML11 and ML12 may be provided at substantially the same level. The first and second lower metal lines ML11 and ML12 may be provided to have the end portions EN1 and EN2, respectively, which are disposed adjacent and parallel to each other. As an example, the end portions EN1 and EN2 may be disposed to be adjacent to a boundary of a cell. The second lower metal line ML12 may have an end portion EN3 opposite to the end portion EN2. When measured in the first direction D1, the first lower metal line ML11 may be provided to have a width smaller than that of the second lower metal line ML12. The first direction D1 may be chosen to cross the second direction D2, and both of the first and second directions D1 and D2 may be chosen to be parallel to a top surface of the substrate.

A first lower via VC11 may be disposed below, and in direct contact with, the first lower metal line ML11, and a second lower via VC12 may be disposed below, and in direct contact with, the second lower metal line ML12. The first lower via VC11 may be adjacent to the end portion EN1 of the first lower metal line ML11, and the second lower via VC12 may be adjacent to the opposite end portion EN3 of the second lower metal line ML12. As an example, the first lower via VC11 and the first lower metal line ML11 may be connected to each other to form a single body, and the second lower via VC12 and the second lower metal line ML12 may be connected to each other to form a single body.

A first upper via VC21 may be disposed on, and in direct contact with, the first lower metal line ML11, and a second upper via VC22 may be disposed on, and in direct contact with, the second lower metal line ML12. The second upper via VC22 may be adjacent to the end portion EN2 of the second lower metal line ML12. When viewed in a plan view, the first upper via VC21 may be spaced apart from the first lower via VC11 in a direction opposite to the second direction D2. By contrast, the second upper via VC22 may be spaced apart from the second lower via VC12 in the second direction D2.

A first upper metal line ML21 and a second upper metal line ML22 may be provided on and in direct contact with the first upper via VC21 and the second upper via VC22, respectively. The first and second upper metal lines ML21 and ML22 may be positioned at substantially the same level. The first and second upper metal lines ML21 and ML22 may extend parallel to each other or in the first direction D1. As an example, the first upper via VC21 and the first upper metal line ML21 may be connected to each other to form a single body, and the second upper via VC22 and the second upper metal line ML22 may be connected to each other to constitute a single body.

In some exemplary embodiments, when viewed in a plan view, the first lower via VC11 may be overlapped with the second upper metal line ML22, and the second lower via VC12 may be overlapped with the first upper metal line ML21. The first lower via VC11 may be electrically connected to an active pattern FN of the substrate, and the second lower via VC12 may be electrically connected to a gate electrode GE crossing the active pattern FN. Accordingly, a first electrical signal Vt1 (e.g., an output signal) may be input to or output from the active pattern FN through the first upper metal line ML21, the first upper via VC21, the first lower metal line ML11, and the first lower via VC11. A second electrical signal Vt2 may be input to or output from the gate electrode GE through the second upper metal line ML22, the second upper via VC22, the second lower metal line ML12, and the second lower via VC12.

In semiconductor devices according to some exemplary embodiments, the first or second electrical signal Vt1 or Vt2 may be transmitted through a straight path that is not parallel to a vertical direction (e.g., a third direction D3). For example, as shown in FIG. 7, the first electrical signal Vt1 and the second electrical signal Vt2 may be transmitted through respective paths that are constructed in a parallel but intercrossing manner. This is because, in the layout design process, the swapping operation is performed on the upper via patterns and the upper metal patterns, as described above.

Figure 8:
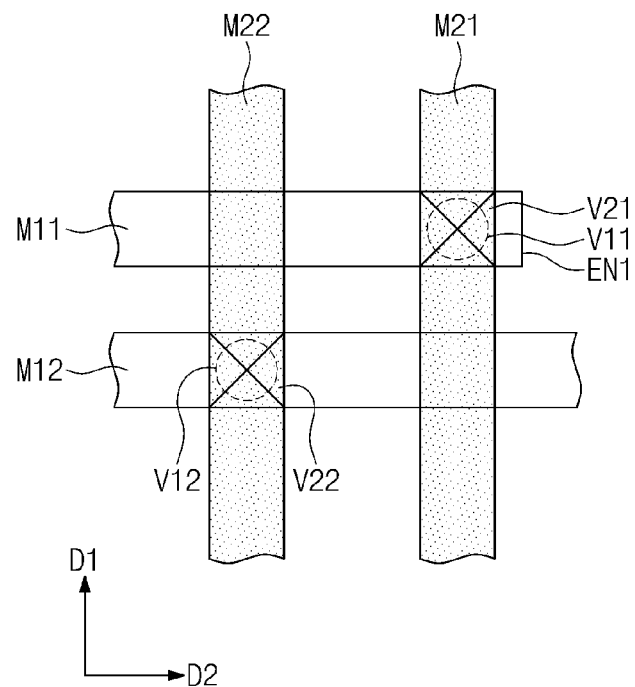
FIGS. 8 through 10 are plan views of layout patterns, which are presented to describe a method of designing a metal layout, according to some exemplary embodiments.
Figure 9:
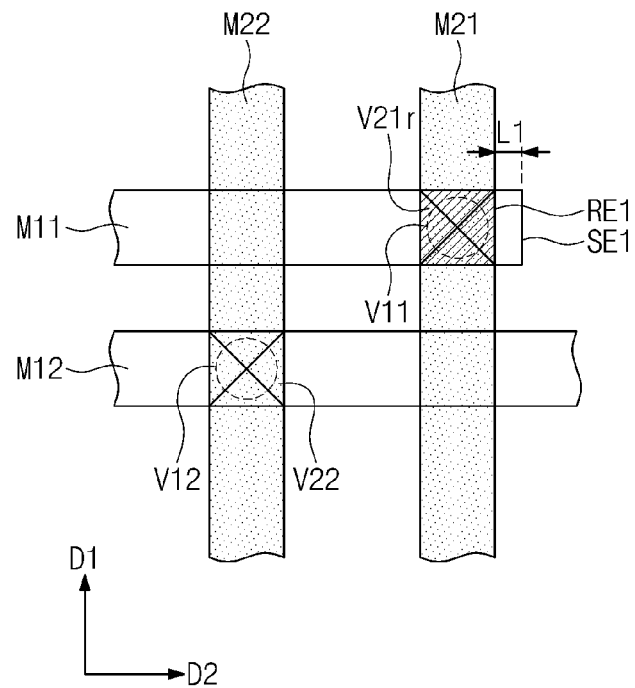
Figure 10:
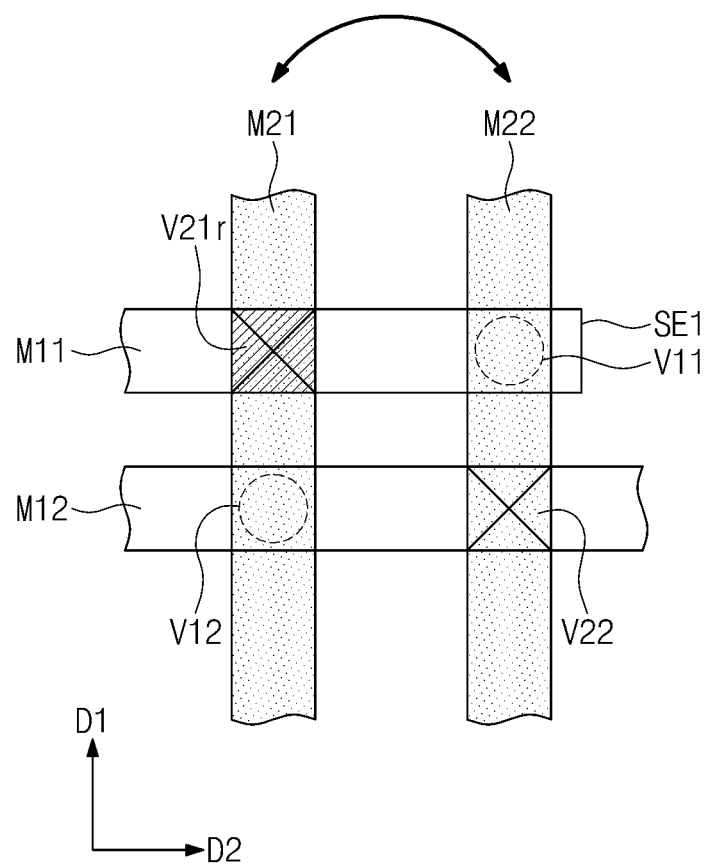

FIGS. 8 through 10 are plan views of layout patterns, which are illustrated to describe a method of designing a metal layout and, in particular, a method of exchanging positions of upper metal patterns, according to some exemplary embodiments. In the following description, an element previously described with reference to FIGS. 4 through 6 may be identified by a similar or identical reference number without repeating an overlapping description thereof.

Referring to FIG. 8, the second lower metal pattern M12 may have substantially the same width as the first lower metal pattern M11. The second lower metal pattern M12 may be elongated in the second direction D2. For example, the second lower metal pattern M12 may be elongated beyond the end portion EN1 of the first lower metal pattern M11 in the second direction D2.

Referring to FIG. 9, the first upper via pattern V21 may have a process risk and may be categorized into the risk via V21r.

Referring to FIG. 10, the first upper metal pattern M21 and the first upper via pattern V21 (i.e., the risk via V21r) may be swapped with the second upper metal pattern M22 and the second upper via pattern V22. In this case, since the second lower metal pattern M12 is longer than the first lower metal pattern M11 in the second direction D2, the swapping may be performed to allow the second upper via pattern V22 to have no process risk.

Figure 11:
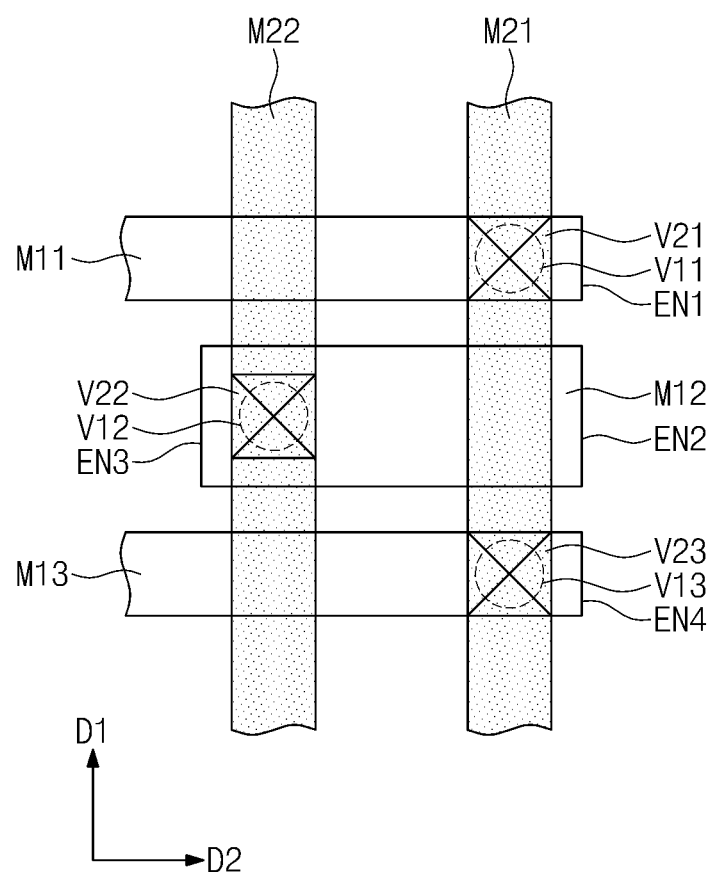
FIGS. 11 through 13 are plan views of layout patterns, which are presented to describe a method of designing a metal layout, according to some exemplary embodiments.
Figure 12:
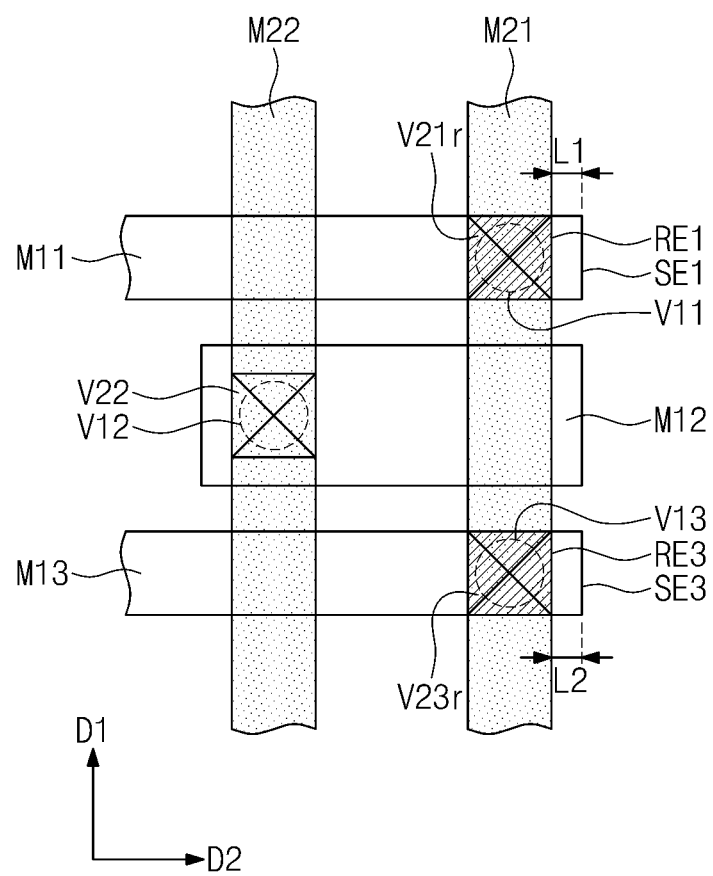
Figure 13:
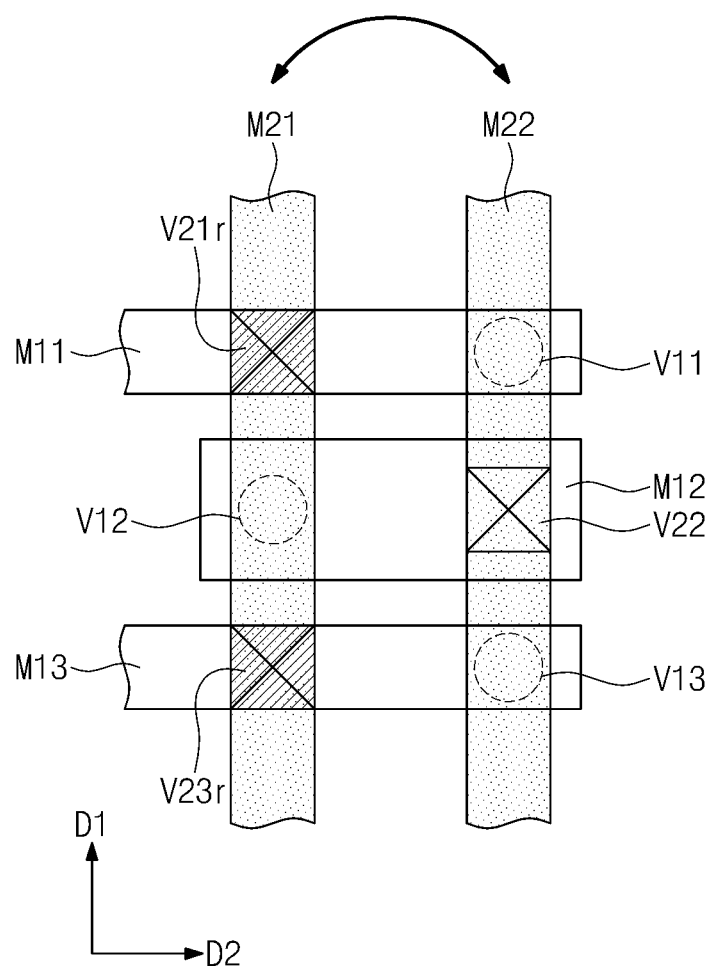

FIGS. 11 through 13 are plan views of layout patterns, which are illustrated to describe a method of designing a metal layout and, in particular, a method of exchanging positions of upper metal patterns, according to some exemplary embodiments. In the following description, an element previously described with reference to FIGS. 4 through 6 may be identified by a similar or identical reference number without repeating an overlapping description thereof.

Referring to FIG. 11, in the original layout of FIG. 4, the lower metal patterns may further include a third lower metal pattern M13, the lower via patterns may further include a third lower via pattern V13, and the upper via patterns may further include a third upper via pattern V23.

The third lower metal pattern M13 may extend parallel to the first and second lower metal patterns M11 and M12 and may extend in the second direction D2. The third lower metal pattern M13 may have substantially the same width as the first lower metal pattern M11. The third lower metal pattern M13 may include an end portion EN4 that is disposed near and parallel to the end portions EN1 and EN2 of the first and second lower metal patterns M11 and M12.

The third lower via pattern V13 may be disposed below the third lower metal pattern M13. As an example, the third lower via pattern V13 may be overlapped with the first upper metal pattern M21 when viewed in a plan view.

The third upper via pattern V23 may be interposed between the third lower metal pattern M13 and the first upper metal pattern M21, when viewed in a vertical section, and may be overlapped with the third lower metal pattern M13 and the first upper metal pattern M21, when viewed in a plan view. In other words, the third upper via pattern V23 may be at an intersect area between the third lower metal pattern M13 and the first upper metal pattern M21.

Referring to FIG. 12, the third upper via pattern V23 may be categorized into an additional risk via V23*r*. For example, the third lower metal pattern M13 may be provided to have an end portion EN3 with a fifth side SE3. The third upper via pattern V23 may have a sixth side RE3 facing the fifth side SE3. The fifth side SE3 and the sixth side RE3 may be spaced apart from each other by a second distance L2. The second distance L2 may be chosen to be smaller than a threshold distance, at which the process risk is assumed to occur.

Referring to FIG. 13, the first upper metal pattern M21 and the first and third upper via patterns V21 and V23 (e.g., V21*r* and V23*r*) may be swapped with the second upper metal pattern M22 and the second upper via pattern V22. Accordingly, as previously described with reference to FIG. 6, it is possible to reduce a process risk at the risk vias V21*r* and V23*r*.

Figure 14:
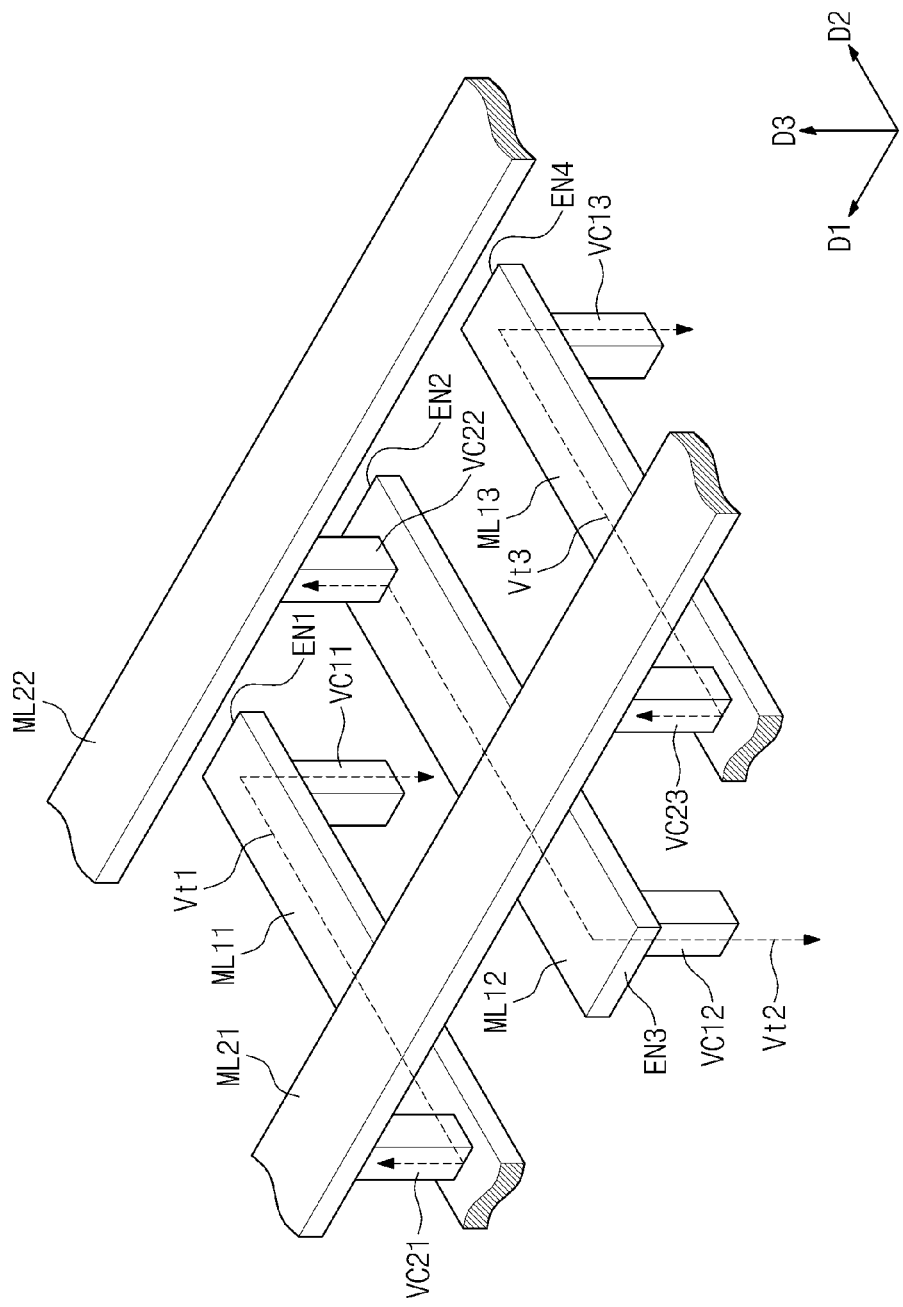
FIG. 14 is a perspective view illustrating a semiconductor device, according to an exemplary embodiment.

FIG. 14 is a perspective view illustrating a semiconductor device, according to some exemplary embodiments. For example, FIG. 14 may be a perspective view illustrating lower vias, a first metal layer, upper vias, and a second metal layer, which are formed based on the layout of FIG. 13. In the following description, an element previously described with reference to FIG. 7 may be identified by a similar or identical reference number without repeating an overlapping description thereof.

Referring to FIG. 14, a third lower metal line ML13 may be additionally provided to extend in the second direction D2. The third lower metal line ML13 may be positioned at substantially the same level as the first and second lower metal lines ML11 and ML12. The third lower metal line ML13 may include an end portion EN4 that is disposed parallel to the end portions EN1 and EN2 of the first and second lower metal lines ML11 and ML12.

A third lower via VC13 may be disposed below, and in direct contact with, the third lower metal line ML13. The third lower via VC13 may be adjacent to the end portion EN4 of the third lower metal line ML13. As an example, the third lower via VC13 and the third lower metal line ML13 may be connected to each other to form a single body.

A third upper via VC23 may be disposed on, and in direct contact with, the third lower metal line ML13. When viewed in a plan view, the third upper via VC23 may be spaced apart from the third lower via VC13 in a direction opposite to the second direction D2.

The first upper metal line M21 may be disposed on, and in direct contact with, the third upper via VC23. As an example, the first upper metal line M21 may extend from the first upper via VC21 to the third upper via VC23, thereby connecting the first upper via VC21 and the third upper via VC23. The third upper via VC23, the first upper via VC21 and the first upper metal line M21 may be formed to constitute a single body.

In some exemplary embodiments, the third lower via VC13 may be overlapped with the second upper metal line ML22, when viewed in a plan view. In addition, the third lower via VC13 may be electrically connected to at least one of the active patterns of the substrate. As a result, a third electrical signal Vt3 (e.g., an output signal) may be input to or output from the active pattern FN through the first upper metal line ML21, the third upper via VC23, the third lower metal line ML13, and the third lower via VC13. In the case where the first electrical signal Vt1 is applied to the first upper metal line ML21, each or both of the first and third electrical signals Vt1 and Vt3 may be input to or output from the active pattern FN.

FIGS. 15 through 18 are plan views of logic cell layouts, which are illustrated to describe a method of designing a metal layout, according to some exemplary embodiments. For example, FIGS. 15 through 18 may illustrate layouts for lower vias, a first metal layer, upper vias, and a second metal layer, which will be sequentially formed on a logic cell. In the following description, an element previously described with reference to FIGS. 4 through 6 may be identified by a similar or identical reference number without repeating an overlapping description thereof.

Figure 15:
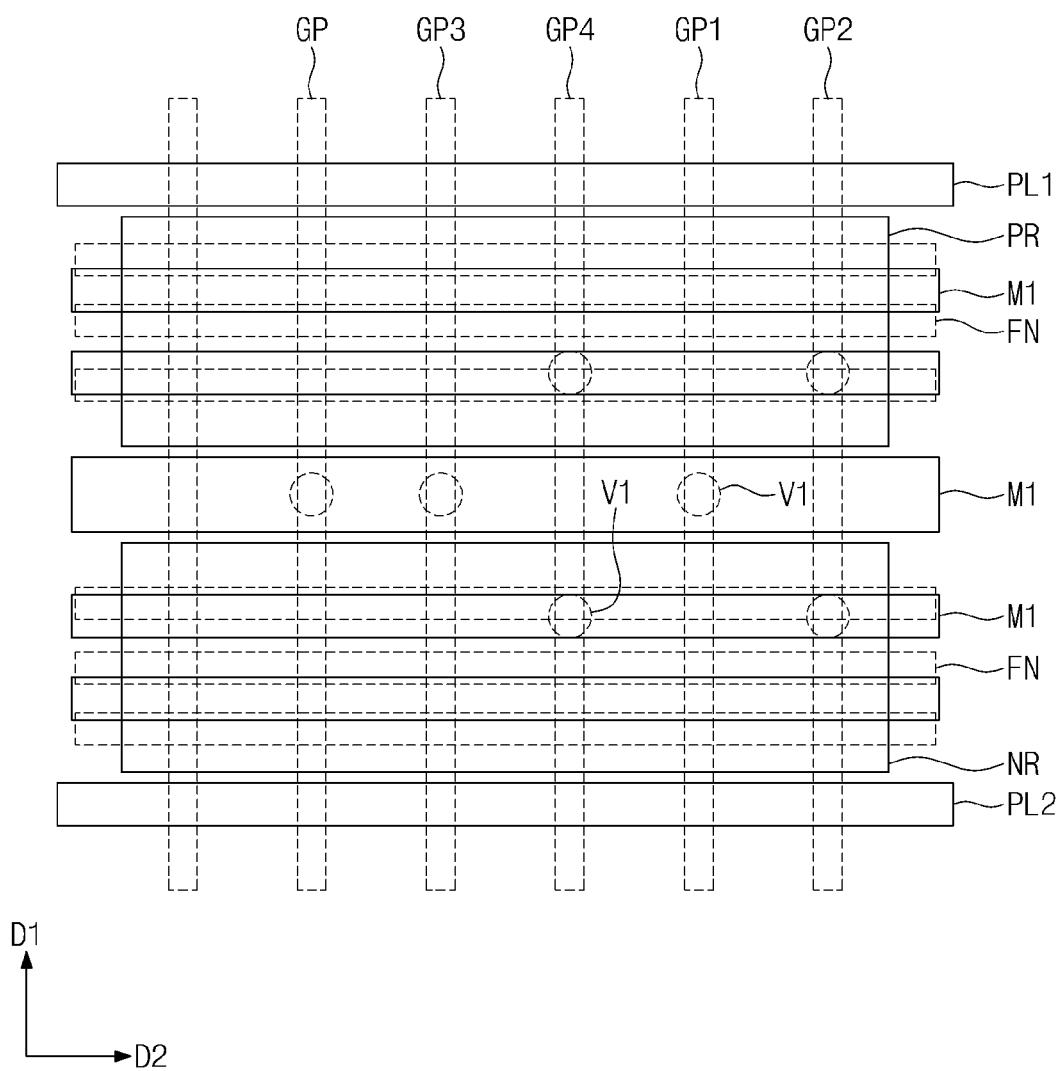
FIGS. 15 through 18 are plan views of logic cell layouts, which are presented to describe a method of designing a metal layout, according to some exemplary embodiments.

Referring to FIG. 15, a first metal layout may be provided on layout patterns including gate patterns GP and active regions PR and NR to define a first metal layer. The active regions PR and NR may include a PMOSFET region PR and an NMOSFET region PR. The active patterns FN may be provided on each of the active regions PR and NR and may extend parallel to each other in the second direction D2. The gate patterns GP may extend in the first direction D1 crossing the second direction D2 and may cross the active patterns FN. As an example, the gate patterns GP may include first to fourth gate patterns GP1-GP4.

The first metal layout may include lower metal lines M1 and a first power line PL1 and a second power line PL2. The lower metal lines M1 and the first and second power lines PL1 and PL2 may extend parallel to each other and in the second direction D2. Here, one of the lower metal lines M1 positioned between the active regions PR and NR may have a width larger than the others of the lower metal lines M1.

Lower via patterns V1 may be disposed below the lower metal lines M1 to define lower vias, which will be provided below the first metal layer. The lower vias may be provided to allow the first metal layer to be electrically connected to gate electrodes and active patterns, which will be described below.

Figure 16:
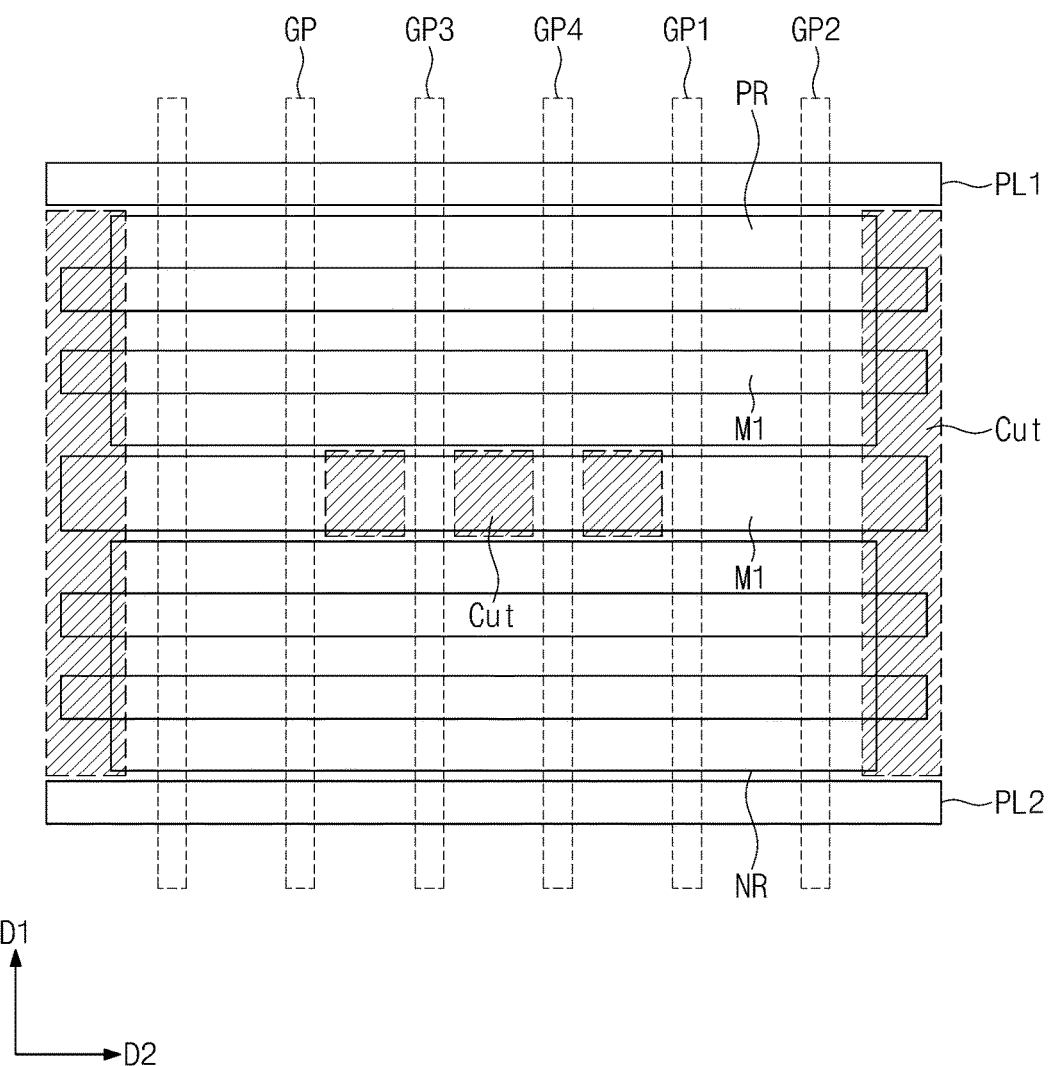

Referring to FIG. 16, cutting patterns (Cut) may be provided on the first metal layout to cut the lower metal lines M1, in consideration of properties for the corresponding logic cell. For convenience in description, the active patterns FN and the lower via patterns V1 are omitted.

As an example, some of the cutting patterns (Cut) may be provided at a boundary of the logic cell to define a shape of each of the lower metal lines M1. Others of the cutting patterns (Cut) may be provided to divide one of the lower metal lines M1 into a plurality of patterns.

Figure 17:
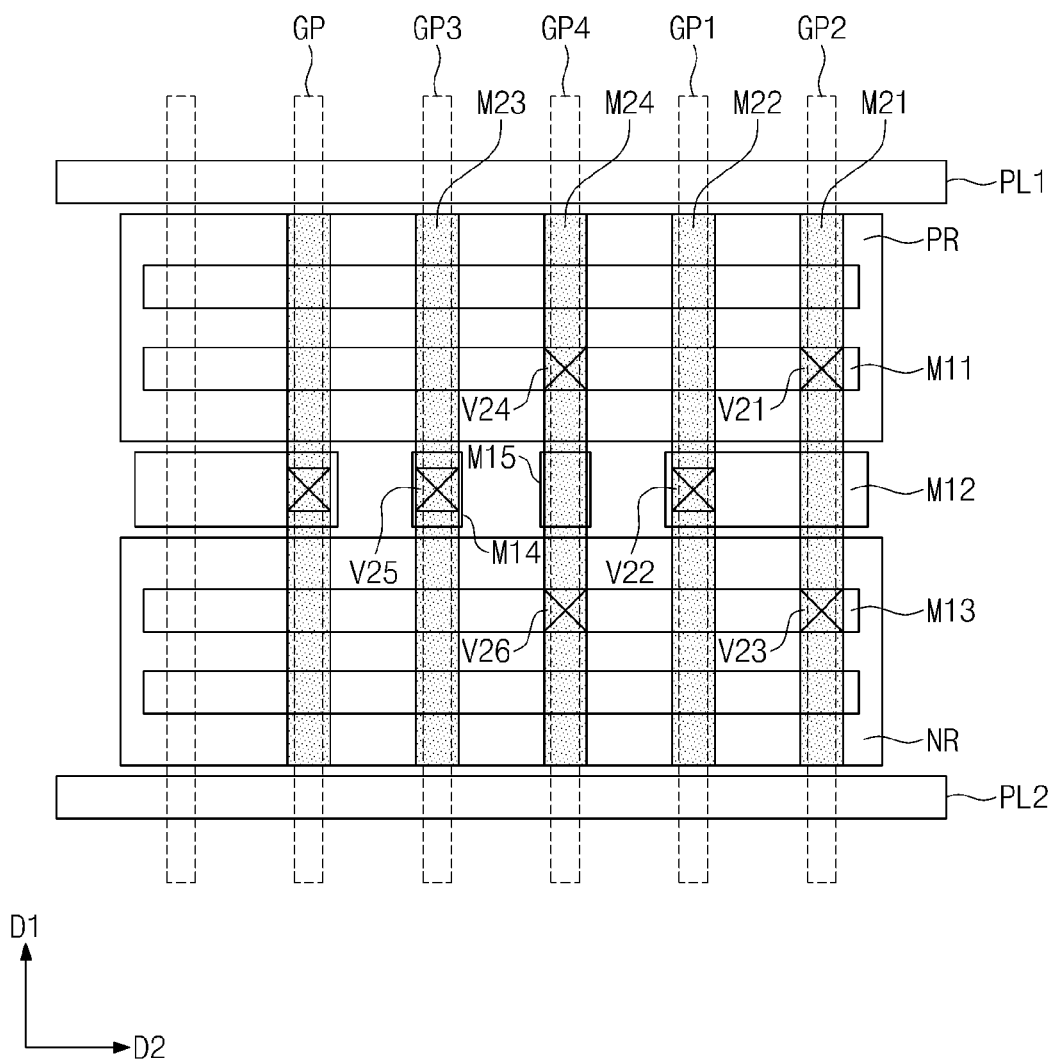

Referring to FIG. 17, a plurality of lower metal patterns may be formed from the lower metal lines M1 of the first metal layout, by the cutting patterns (Cut). As an example, the lower metal patterns may include first to fifth lower metal patterns M11-M15. The second, fourth, and fifth lower metal patterns M12, M14, and M15 may be provided to have widths that are larger than the others of the lower metal patterns. However, the second, fourth and fifth lower metal patterns M12, M14, and M15 may be provided to be shorter than the others of the lower metal patterns in the second direction D2.

Thereafter, a second metal layout may be provided on the first metal layout to define a second metal layer. The second metal layout may include upper metal patterns, which extend in the first direction D1 crossing the second direction D2 and have a line shape. For example, the upper metal patterns may include first to fourth upper metal patterns M21-M24.

Upper via patterns may be provided between the first and second metal layouts to define electric connection paths between the first and second metal layouts. As an example, the upper via patterns may include first to sixth upper via patterns V21-V26. For example, the first upper via pattern V21 may be provided between the first lower metal pattern M11 and the first upper metal pattern M21, the second upper via pattern V22 may be provided between the second lower metal pattern M12 and the second upper metal pattern M22, the third upper via pattern V23 may be provided between the third lower metal pattern M13 and the first upper metal pattern M21, the fourth upper via pattern V24 may be provided between the first lower metal pattern M11 and the fourth upper metal pattern M24, the fifth upper via pattern V25 may be provided between the fourth lower metal pattern M14 and the third upper metal pattern M23, and the sixth upper via pattern V26 may be provided between the third lower metal pattern M13 and the fourth upper metal pattern M24.

Figure 18:
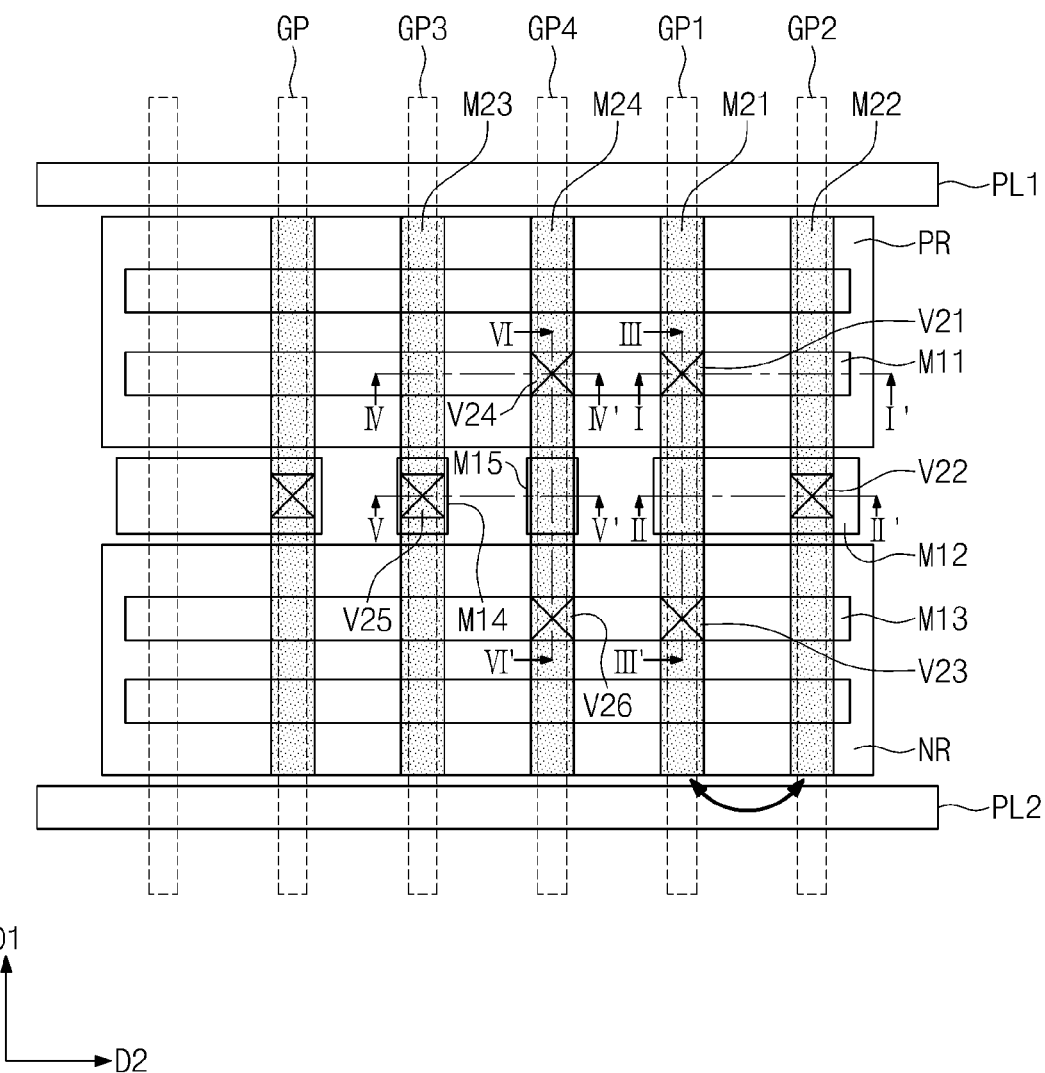

Referring to FIG. 18, the first and third upper via patterns V21 and V23 may be disposed adjacent to a boundary of the logic cell, thereby having a process risk as previously described with reference to FIGS. 12 and 13. Accordingly, a group of the first and third upper via patterns V21 and V23 and the first upper metal pattern M21 may be swapped with another group of the second upper via pattern V22 and the second upper metal pattern M22, as shown by the dark arrow in FIG. 18.

By contrast, possibility of the process risk may be low in the fourth and sixth upper via patterns V24 and V26, because the fourth and sixth upper via patterns V24 and V26 are sufficiently spaced apart from end portions of the first and third lower metal patterns M11 and M13, and thus, positions of the fourth and sixth upper via patterns V24 and V26 may be fixed. In addition, since the fifth upper via pattern V25 is disposed on the fourth lower metal pattern M14 having a relatively large width, the possibility of the process risk may be very low in the fifth upper via pattern V25.

Figure 19A:
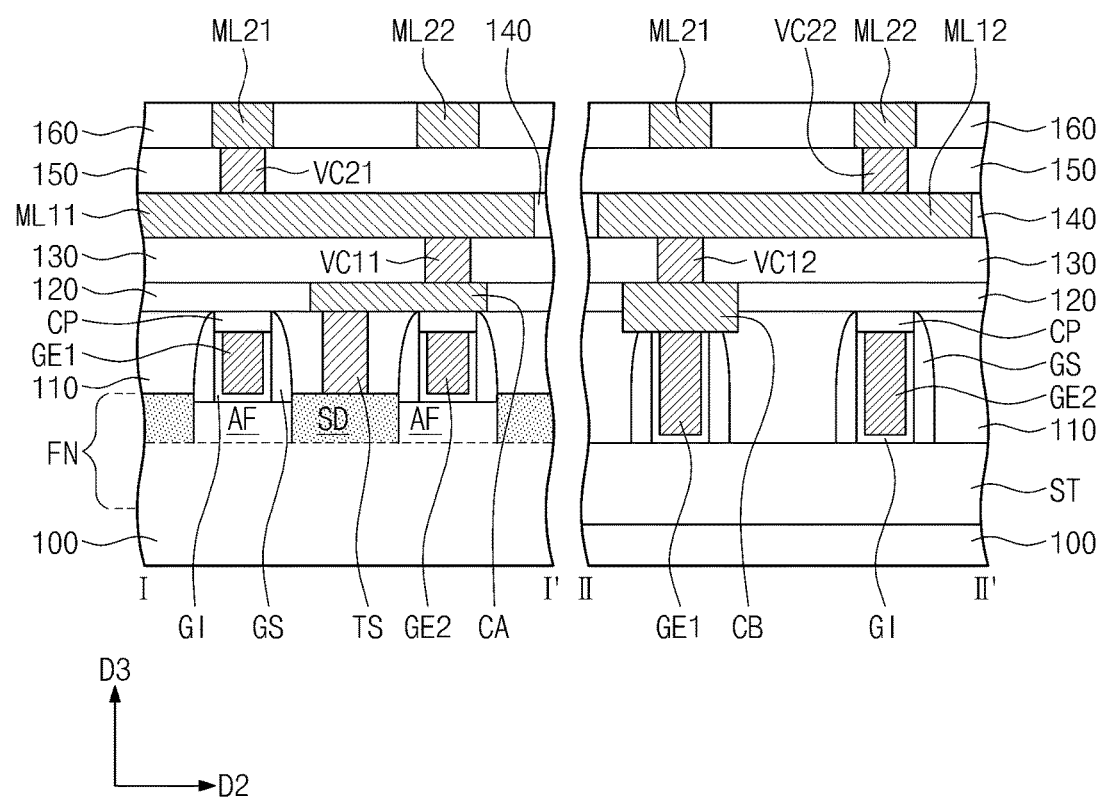
FIGS. 19A and 19B are sectional views illustrating a semiconductor device according to some exemplary embodiments.
Figure 19B:
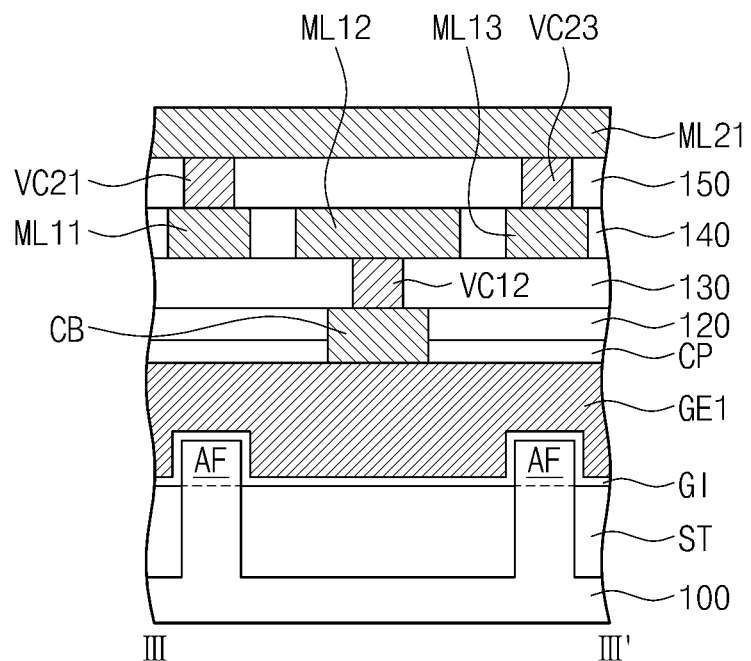

FIGS. 19A and 19B are sectional views illustrating a semiconductor device according to some exemplary embodiments. For example, FIG. 19A may be a sectional view taken along lines I-I' and II-II' of FIG. 18, and FIG. 19B may be a sectional view taken along line III-III' of FIG. 18. Also, FIGS. 19A and 19B illustrate an example of a semiconductor device, which may be fabricated based on the layout previously described with reference to FIG. 18.

The semiconductor device of FIGS. 19A and 19B may include several patterns, each of which is actually formed on a semiconductor substrate by a photolithography process using the layout patterns. Such patterns of the semiconductor device may not be identical with the layout patterns, in that the layout patterns are elements defined in a design operation or in the form of data.

Referring to FIGS. 18, 19A, and 19B, device isolation layers ST may be provided in or on a substrate 100 to define active patterns FN. In some exemplary embodiments, the device isolation layers ST may be formed in an upper portion of the substrate 100. As an example, the substrate 100 may be a silicon wafer, a germanium wafer, or a silicon-on-insulator (SOI) wafer. The device isolation layers ST may be formed of or may include a silicon oxide layer.

The active patterns FN may be formed to extend in a second direction D2 parallel to a top surface of the substrate 100. The active patterns FN may be arranged in a first direction D1 crossing the second direction D2. In some exemplary embodiments, each of the active patterns FN may include an upper portion serving as a fin active region. For example, the fin active region may be formed between the device isolation layers ST to have an upward protruding shape.

Gate electrodes GE may be provided on the active patterns FN to cross the active patterns FN and extend in the first direction D1. The gate electrodes GE may include first and second gate electrodes GE1 and GE2, which may correspond to first and second gate patterns GP1 and GP2, respectively, of FIG. 18.

A gate insulating pattern GI may be provided below each of the first and second gate electrodes GE1 and GE2, and gate spacers GS may be provided at both sides of each of the first and second gate electrodes GE1 and GE2. In addition, a capping pattern CP may be provided to cover a top surface of each of the first and second gate electrodes GE1 and GE2. However, the capping pattern CP may be partially removed to expose a portion of the first gate electrode GE1, thereby allowing the gate contact CB to be connected to the first gate electrode GE1.

The first and second gate electrodes GE1 and GE2 may include at least one of doped semiconductors, metals, or conductive materials. The gate insulating pattern GI may include at least one of a silicon oxide layer, a silicon oxynitride layer, or a high-k dielectric layer whose dielectric constant is higher than that of a silicon oxide layer. Each or at least one of the capping pattern CP and the gate spacers GS may include at least one of a silicon oxide layer, a silicon nitride layer, or a silicon oxynitride layer.

Source/drain regions SD may be provided on or in portions of the active patterns FN, which are positioned at both of each of the first and second gate electrodes GE1 and GE2. The active patterns may include portions (e.g., the fin portions), which are positioned below the first and second gate electrodes GE1 and GE2, respectively, and are interposed between the source/drain regions SD, and the fin portions may serve as channel regions AF of the transistors.

The source/drain regions SD may be epitaxial patterns, which are grown by a selective epitaxial growth process. The source/drain regions SD may include a semiconductor element different from those of the substrate 100. As an example, the source/drain regions SD may be formed of or include a semiconductor material having a lattice constant different from (for example, greater or smaller than) the substrate 100. Accordingly, the source/drain regions SD may exert a compressive stress or a tensile stress on the channel regions AF.

First to sixth interlayer insulating layers 110-160 may be provided on the substrate 100 to cover the first and second gate electrodes GE1 and GE2. Each of the first to sixth interlayer insulating layers 110-160 may be formed of or include a silicon oxide layer or a silicon oxynitride layer.

A source/drain contact TS may be provided between the first and second gate electrodes GE1 and GE2 to pass through the first interlayer insulating layer 110. The source/drain contact TS may be directly coupled to, and electrically connected to, the source/drain region SD. An intermediate contact CA may be provided in the second interlayer insulating layer 120 to be in direct contact with the source/drain contact TS. Furthermore, a gate contact CB may be provided on, and directly coupled to, the first gate electrode GE1.

First and second lower vias VC11 and VC12 may be provided on the second interlayer insulating layer 120 and in the third interlayer insulating layer 130. The first and second lower vias VC11 and VC12 may correspond to the lower via patterns V1 previously described with reference to FIG. 15. The first lower via VC11 may be coupled to the intermediate contact CA, and the second lower via VC12 may be coupled to the gate contact CB.

A first metal layer may be provided on the third interlayer insulating layer 130 and in the fourth interlayer insulating layer 140. The first metal layer may include first to third lower metal lines ML11, ML12, and ML13. The first to third lower metal lines ML11, ML12, and ML13 may correspond to the first to third lower metal patterns M11, M12, and M13, respectively, of FIG. 18.

As an example, the first lower metal line ML11 may be electrically connected to the source/drain region through the first lower via VC11, the intermediate contact CA, and the source/drain contact TS. The second lower metal line ML12 may be electrically connected to the first gate electrode GE1 through the second lower via VC12 and the gate contact (CB).

The first to third upper vias VC21-VC23 may be provided on the fourth interlayer insulating layer 140 and in the fifth interlayer insulating layer 150. The first to third upper vias VC21-VC23 may correspond to the first to third upper via patterns V21-V23, respectively, of FIG. 18.

A second metal layer may be provided the sixth interlayer insulating layer 160 and on the fifth interlayer insulating layer 150. The second metal layer may include first and second upper metal lines ML21 and ML22. The first and second upper metal lines ML21 and ML22 may correspond to the first and second upper metal patterns M21 and M22, respectively, described with reference to FIG. 18.

As an example, the first upper metal line ML21 may be electrically connected to the first lower metal line ML11 through the first upper via VC21. The second upper metal line ML22 may be electrically connected to the second lower metal line ML12 through the second upper via VC22.

The first and second metal layers may be formed by the design and fabrication methods described with reference to FIG. 2. For example, the first and second metal layouts described with reference to FIG. 18 may be prepared by a high-level design process and a layout design process for a semiconductor integrated circuit. Thereafter, an optical proximity correction may be performed to prepare modified metal layouts, and photomasks may be manufactured, based on the modified metal layouts.

The formation of the first metal layer may include forming a photoresist pattern, whose position and shape are defined by the first metal layout, on the fourth interlayer insulating layer 140. For example, a photoresist layer may be formed on the fourth interlayer insulating layer 140. Thereafter, an exposure process may be performed on the photoresist layer using the photomask, which is manufactured based on the first metal layout, and next, a development process may be performed on the photoresist layer. As a result, the photoresist pattern may be formed. In some exemplary embodiments, the photoresist pattern may be formed to have openings defining metal line holes.

Thereafter, the fourth interlayer insulating layer 140 may be etched using the photoresist pattern as an etch mask to form the metal line holes. Next, the first to third lower metal lines ML11-ML13 may be formed by filling the metal line holes with a conductive material. The conductive material may be formed of or include a metallic material (e.g., copper).

The second metal layer may be formed by a method similar to that for the first metal layer. The lower vias and the upper vias may also be formed by a method similar to that for the first metal layer.

Figure 20A:
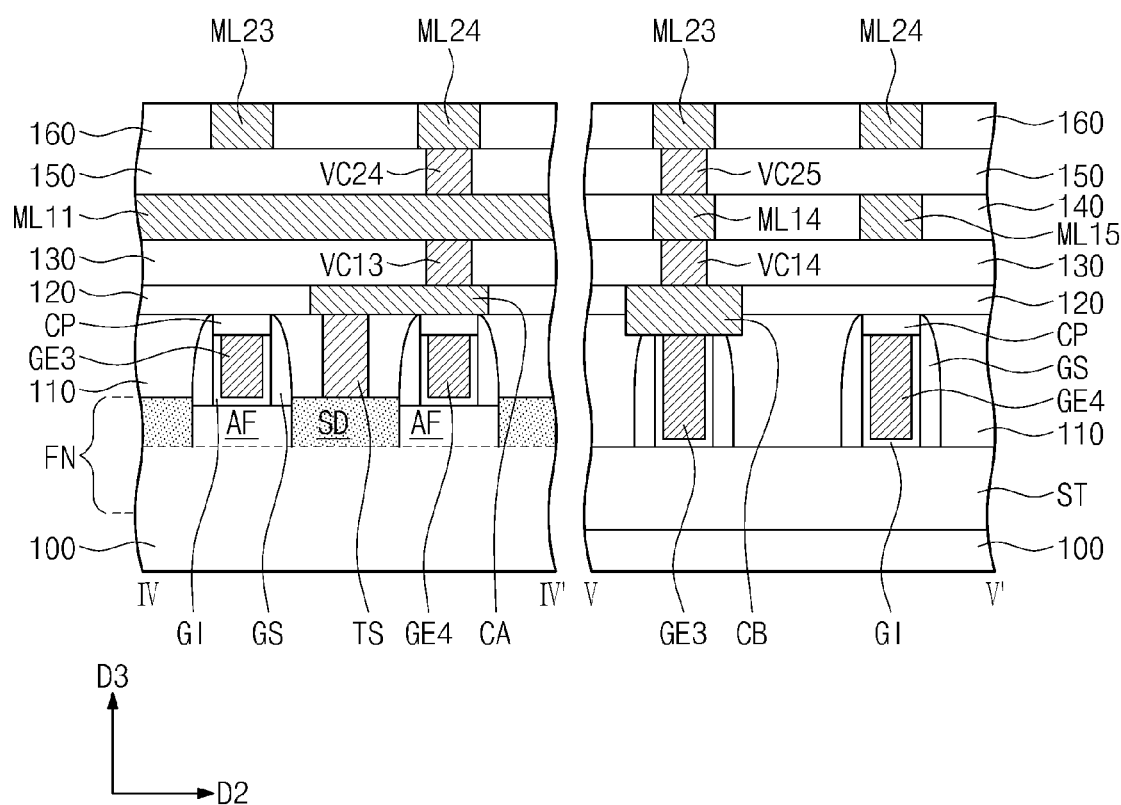
FIGS. 20A and 20B are sectional views illustrating a semiconductor device according to some exemplary embodiments.
Figure 20B:
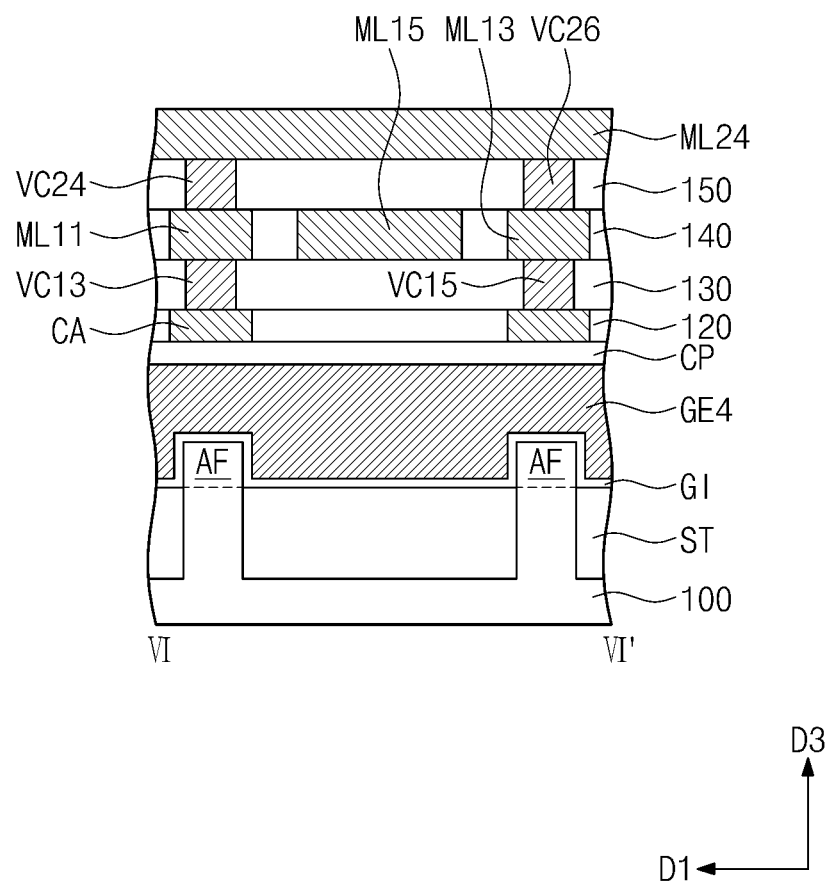

FIGS. 20A and 20B are sectional views illustrating a semiconductor device according to some exemplary embodiments. For example, FIG. 20A may be a sectional view taken along lines IV-IV' and V-V' of FIG. 18, and FIG. 20B may be a sectional view taken along line VI-VI' of FIG. 18. Also, FIGS. 20A and 20B illustrate an example of a semiconductor device, which may be fabricated based on the layout previously described with reference to FIG. 18. In the following description, an element previously described with reference to FIGS. 19A and 19B may be identified by a similar or identical reference number without repeating an overlapping description thereof.

Referring to FIGS. 18, 20A, and 20B, third to fifth lower vias VC13, VC14, and VC15 may be provided in the third interlayer insulating layer 130. The third to fifth lower vias VC13, VC14, and VC15 may correspond to the lower via patterns V1 described with reference to FIG. 15. The third and fifth lower vias VC13 and VC15 may be coupled to the intermediate contacts CA, respectively, and the fourth lower via VC14 may be coupled to the gate contact CB.

A first metal layer may be provided in the fourth interlayer insulating layer 140. The first metal layer may further include fourth and fifth lower metal lines ML14 and ML15, in addition to the first to third lower metal lines ML11-ML13. The fourth and fifth lower metal lines ML14 and ML15 may correspond to the fourth and fifth lower metal patterns M14 and M15, respectively, of FIG. 18.

Fourth to sixth upper vias VC24-VC26 may be provided in the fifth interlayer insulating layer 150. The fourth to sixth upper vias VC24-VC26 may correspond to the fourth to sixth upper via patterns V24-V26, respectively, of FIG. 18.

A second metal layer may be provided on the fifth interlayer insulating layer 150 and in the sixth interlayer insulating layer 160. The second metal layer may further include third and fourth upper metal lines ML23 and ML24, in addition to the first and second upper metal lines ML21 and ML22. The third and fourth upper metal lines ML23 and ML24 may correspond to the third and fourth upper metal patterns M23 and M24, respectively, of FIG. 18.

Unlike that described with reference to FIGS. 19A and 19B, the third lower via VC13, the first lower metal line ML11, the fourth upper via VC24, and the fourth upper metal line ML24 may be directly or straightly stacked in a vertical direction. The fourth lower via VC14, the fourth lower metal line ML14, the fifth upper via VC25, and the third upper metal line ML23 may be directly or straightly stacked in the vertical direction. The fifth lower via VC15, the third lower metal line ML13, the sixth upper via VC26, and the fourth upper metal line ML24 may be directly or straightly stacked in the vertical direction. This straight arrangement in the vertical direction is because, unlike the first and second upper metal patterns M21 and M22, the third and fourth upper metal patterns M23 and M24 are not swapped with each other.

A layout design method including a swapping operation is disclosed. According to some exemplary embodiments, the swapping operation may be performed to swap adjacent ones of upper metal patterns with each other. A layout prepared through the layout design method may be used to fabricate a semiconductor device. The swapping operation may be performed to swap underlying via patterns with each other, and this swapping may make it possible to effectively reduce a process risk. Furthermore, since there is no need to change a size of a cell, it is possible to realize a highly-integrated semiconductor device.

In the case where the layout design method is used to fabricate a semiconductor device, electrical signals may be applied to adjacent ones of the upper metal lines through respective paths that are constructed in a parallel but intercrossing manner.

While some exemplary embodiments have been particularly shown and described, it will be understood by one of ordinary skill in the art that variations in form and detail may be made therein without departing from the spirit and scope of the attached claims.

What is claimed is:

1. A semiconductor device comprising:
a substrate;
a gate electrode crossing an active pattern of the substrate;
an interlayer insulating layer covering the active pattern and the gate electrode;
a first lower via provided in the interlayer insulating layer and electrically connected to the active pattern;
a second lower via provided in the interlayer insulating layer and electrically connected to the gate electrode;
a first lower metal line provided on the interlayer insulating layer, the first lower metal line extending in a first direction and directly contacting the first lower via;
a second lower metal line provided on the interlayer insulating layer, the second lower metal line extending in the first direction and directly contacting the second lower via;
a first upper metal line provided on the first and second lower metal lines, the first upper metal line extending in a second direction crossing the first direction and being electrically connected to the first lower metal line; and
a second upper metal line provided on the first and second lower metal lines, the second upper metal line extending in the second direction and being electrically connected to the second lower metal line, wherein, when viewed in a plan view, the first lower via is overlapped with the second upper metal line and the second lower via is overlapped with the first upper metal line.

2. The device of claim 1, further comprising:
a first upper via provided between the first lower metal line and the first upper metal line, the first upper via electrically connecting the first lower metal line and the first upper metal line; and
a second upper via provided between the second lower metal line and the second upper metal line, the second upper via electrically connecting the second lower metal line and the second upper metal line,
wherein, when viewed in a plan view, the first upper via is spaced apart from the first lower via in the first direction, and the second upper via is spaced apart from the second lower via in a direction opposite to the first direction.

3. The device of claim 1, further comprising:
a third lower via provided in the interlayer insulating layer, the third lower via electrically connecting to another active pattern of the substrate; and
a third lower metal line provided on the interlayer insulating layer, the third lower metal line extending in the first direction and directly contacting the third lower via,
wherein the third lower metal line is electrically connected to the first upper metal line, and
the third lower via is overlapped with the second upper metal line, when viewed in a plan view.

4. The device of claim 1, wherein the first and second lower metal lines are positioned at substantially the same level, when viewed in the plan view,
the first and second upper metal lines are positioned at substantially the same level, when viewed in the plan view,
the first and second lower metal lines are spaced apart from each other in the second direction, and
the first and second upper metal lines are spaced apart from each other in the first direction.

5. The device of claim 1, further comprising a device isolation layer provided in the substrate to define the active pattern,
wherein the active pattern comprises an upper portion protruding upward from the device isolation layer.

6. The device of claim 1, wherein the active pattern comprises source and drain regions provided at both sides of the gate electrode, and
the first lower via is electrically connected to at least one of the source/drain regions.

7. The device of claim 1, wherein a width of the second lower metal line is greater than a width of the first lower metal line.

8. A semiconductor device comprising:
a substrate;
a plurality of transistors disposed on the substrate;
a first interlayer insulating layer covering the transistors;
a first lower via and a second lower via provided in the first interlayer insulating layer, each of the first and second lower vias being electrically connected to at least one of the transistors;
a first lower metal line provided on the first interlayer insulating layer, the first lower metal line extending in a first direction and directly contacting the first lower via;

a second lower metal line provided on the first interlayer insulating layer, the second lower metal line extending in the first direction and directly contacting the second lower via;

a second interlayer insulating layer covering the first and second lower metal lines;

a first upper via provided in the second interlayer insulating layer, the first upper via directly contacting the first lower metal line;

a second upper via provided in the second interlayer insulating layer, the second upper via directly contacting the second lower metal line;

a first upper metal line provided on the second interlayer insulating layer, the first upper metal line extending in a second direction crossing the first direction and directly contacting the first upper via; and a second upper metal line provided on the second interlayer insulating layer, the second upper metal line extending in the second direction and directly contacting the second upper via, wherein, when viewed in a plan view, the first upper via is spaced apart from the first lower via in the first direction and the second upper via is spaced apart from the second lower via in a direction opposite to the first direction.

9. The device of claim 8, wherein the first lower via, the first lower metal line, and the first upper via are disposed to allow signals output from the transistor that is connected to the first lower via to be transmitted to the first upper metal line through the first lower via, the first lower metal line and the first upper via.

10. The device of claim 8, wherein the second upper metal line, the second upper via, the second lower metal line, and the second lower via are disposed to allow signals to be applied from the second upper metal line to a gate of the transistor that is connected to the second lower via.

11. The device of claim 8, wherein, when viewed in a plan view, an end portion of the first lower metal line and an end portion of the second lower metal line are disposed to be parallel to the second upper metal line.

12. The device of claim 8, wherein, when viewed in a plan view, the first lower via is overlapped with the second upper metal line and the second lower via is overlapped with the first upper metal line.

13. The device of claim 8, wherein a width of the second lower metal line is greater than a width of the first lower metal line.

* * * * *